United States Patent [19]
Yatsurugi

[11] Patent Number: 6,007,621
[45] Date of Patent: Dec. 28, 1999

[54] APPARATUS FOR FEEDING RAW MATERIAL INTO A QUARTZ CRUCIBLE AND METHOD OF FEEDING THE SAME

[75] Inventor: Yoshifumi Yatsurugi, Kanagawa, Japan

[73] Assignee: Komatsu Elctronic Metals Co., Ltd., Kanagawa, Japan

[21] Appl. No.: 09/158,518

[22] Filed: Sep. 22, 1998

Related U.S. Application Data

[62] Division of application No. 09/016,949, Feb. 2, 1998.

[30] Foreign Application Priority Data

| Jan. 31, 1997 | [JP] | Japan | 9-32674 |
| Feb. 4, 1997 | [JP] | Japan | 9-34272 |
| Mar. 10, 1997 | [JP] | Japan | 9-74378 |
| Jul. 10, 1997 | [JP] | Japan | 9-202304 |
| Oct. 8, 1997 | [JP] | Japan | 9-290564 |

[51] Int. Cl.$^6$ .................................................. G30B 15/20
[52] U.S. Cl. ........................... 117/14; 117/33; 117/214
[58] Field of Search ........................ 117/14, 33, 214, 117/900

[56] References Cited

U.S. PATENT DOCUMENTS

| 5,580,171 | 12/1996 | Lim et al. | 366/336 |
| 5,588,993 | 12/1996 | Holder | 117/13 |
| 5,868,835 | 2/1999 | Nagai et al. | 117/201 |

*Primary Examiner*—Felisa Hiteshew
*Attorney, Agent, or Firm*—Sughrue, Mion, Zinn Macpeak & Seas, PLLC

[57] ABSTRACT

The invention is to provide a method for automatically and rapidly feeding raw material into a quartz crucible in manufacture of single-crystal silicon by CZ method. For example, after a draining hose 203 is disposed in a quartz crucible 201, pure water is supplied from a water supply hose 204, and the quartz crucible 201 is conveyed onto a turn table 213 installed under a container 210. At this time, the quartz crucible 201 is rotated, and lump raw material 209 is fed into the quartz crucible 201. Since buoyancy of the pure water is applied to the lump material 209, impacts caused by the falling lump material can be moderated, and therefore, damages to the quartz crucible 201 can be prevented. After feeding raw material is finished, the pure water is discharged through a draining hose 203, and then the draining hose 203 is retracted from the quartz crucible 201. Thereafter, the quartz crucible 201 is conveyed into a microwave oven 211 for drying.

16 Claims, 13 Drawing Sheets

APPARATUS FOR FEEDING RAW MATERIAL INTO A QUARTZ CRUCIBLE AND METHOD OF FEEDING THE SAME

This is a divisional of application Ser. No. 09/016,949 filed Feb. 2, 1998, the disclosure of which is incorporated herein by reference now allowed.

BACKGROUND OF THE INVENTION

1. Field of the Invention

The invention relates to apparatus and a method and for feeding raw material into a quartz crucible during manufacture of single-crystal by CZ method.

2. Description of the Prior Art

High-purity single-crystal silicon is mainly used as substrates in semiconductor manufacturing. Generally, a method for manufacturing single-crystal silicon is based on the CZ method. In the CZ method, a quartz crucible into which lump polycrystalline silicon materials are fed, is disposed inside an apparatus for manufacturing single-crystal silicon. The lump polycrystalline silicon is melted into a melt by a heater surrounding a quartz crucible. Furthermore, after dipping a seed which is disposed on a seed holder into the melt, the seed holder and quartz crucible rotate in the same direction or in opposite directions. Meanwhile the seed holder is pulled to grow single-crystal silicon.

In the CZ method, a predetermined amount of polycrystalline silicon material must be fed into the quartz crucible before manufacturing the single-crystal silicon. The polycrystalline silicon is lumpy, has acute angles and extremely high hardness. Moreover, since the quartz crucible is brittlepiece, a lump of polycrystalline silicon with 20~110 mm in size, which occupies over 90% volume of the quartz crucible, is fed into the quartz crucible by man-hand in order to prevent the crucible being broken. Therefore, feeding raw material is a really simple operation, but the using time for feeding raw material, in particular for manufacturing larger single-crystal silicon, become more longer.

SUMMARY OF THE INVENTION

In light of the above drawbacks, the object of the present invention is to provide a method and an apparatus capable of rapidly feeding polycrystalline silicon lumps (raw material) into a quartz crucible without any hand operation in the process of manufacturing silicon single-crystal employing the CZ method.

A first aspect of the apparatus for feeding raw material into a crucible, used for feeding polycrystalline silicon as raw material into a crucible before manufacturing silicon single crystal by the CZ method, is an apparatus of the present invention, which comprises:

means for feeding polycrystalline silicon lumps into the crucible;

means for covering the inner wall of the crucible with a buffer of any one or a mixture of those selected from the group of pieces of polycrystalline silicon, grains of polycrystalline silicon, pure-water snow, sherbet-shaped pure-water ice, pure-water ice pieces, and pure-water ice;

means for draining the liquid melted from the buffer from the crucible; and means for drying the crucible and the polycrystalline silicon fed into the crucible.

A second aspect of the apparatus is an apparatus according to the first aspect, further comprising the means for rotating and transporting the crucible.

A third aspect of the apparatus is an apparatus according to the first aspect, further comprising:

a resin tube capable of covering the inner sidewall of the crucible;

means for moving up and down the above resin tube within a predetermined range; and means for rotating the resin tube at a speed equivalent to that of the crucible.

A fourth aspect of the apparatus is an apparatus according to the first aspect, further comprising:

means for moving up and down said feeding means and said covering means within a predetermined range and moving them in the horizontal direction reciprocally.

A fifth aspect of the apparatus is an apparatus according to the first aspect, further comprising:

means for automatically controlling at least one of said means for feeding polycrystalline silicon lumps; means for covering;

means for draining; and means for drying.

A sixth aspect of the apparatus is an apparatus according to the first aspect, wherein the draining means comprise a draining hose, a insert part of which is inserted into the crucible so as to drain the liquid melted from the buffer and the insert part is made of one of a polycrystalline silicon pipe, a single-crystal silicon pipe with a purity essentially the same as that of polycrystalline silicon lumps;

and a pipe coated by a polycrystalline silicon pipe or a single-crystal silicon pipe with a purity essentially the same as that of the polycrystalline silicon lumps.

A seventh aspect of the method of feeding raw material into a crucible before pulling silicon single crystal from the crucible by the CZ method is a method of the present invention, which comprises the steps of:

covering the inner wall surface of the crucible with a buffer of any one or a mixture of those selected from the group of pieces of polycrystalline silicon, grains of polycrystalline silicon, pure-water snow, sherbet-shaped pure-water ice, pure-water ice pieces, or pure-water ice before feeding polycrystalline silicon lumps as raw material into the crucible;

feeding polycrystalline silicon lumps as raw material into the crucible;

pouring pure water into the crucible to melt the buffer left therein so as to expel the water out of the crucible after the step of feeding drying the crucible and the polycrystalline silicon lumps in the crucible.

A eighth aspect of the method is a method according to the seventh aspect, wherein the pouring step comprises a step of pouring a heated water into the crucible.

A ninth aspect of the method is a method according to the seventh aspect, wherein the steps of covering further comprises the steps of covering the covered inner wall surface of the crucible with any one or a mixture of pure-water snow or pure-water ice pieces.

A tenth aspect of the method is a method according to the seventh aspect, wherein the steps of covering comprises a step of fixing a ring shaped pure-water ice to the inner sidewall surface of the crucible.

An eleventh aspect of the method is a method according to the tenth aspect, wherein the steps of covering further comprises the steps of covering the covered inner wall surface of the crucible with a second buffer of any one or a mixture of those selected from pieces of polycrystalline silicon, grains of polycrystalline silicon, pure-water snow, or pure-water ice pieces A twelfth aspect of the method is a method according to the seventh aspect, wherein the steps of covering comprises the steps of:
covering at least the bottom part of the inner surface of the crucible with the buffer; and
covering the inner sidewall of the crucible with a resin tube capable of moving up and down.

A thirteenth aspect of the method is a method according to the twelfth aspect, wherein after feeding polycrystalline silicon lumps, the resin tube is moved up and withdrawn from the crucible.

A fourteenth aspect of the method is a method according to the thirteenth aspect, wherein the resin tube is gradually raised in response to the progress of feeding the polycrystalline silicon lumps, and the resin tube is completely withdrawn from the crucible at the end of feeding the polycrystalline silicon lumps.

A fifteenth aspect of the method of feeding raw material into a crucible before pulling silicon single crystal from the crucible by the CZ method is a method of the present invention, comprising the steps of:

covering the inner wall surface of the crucible with a buffer of piece-shaped or grain-shaped polycrystalline silicon before feeding polycrystalline silicon lumps as raw material into the crucible;

covering the inner sidewall of the crucible with a resin tube capable of moving up and down; and feeding polycrystalline silicon lumps as raw material into the crucible.

A sixteenth aspect of the apparatus is an apparatus according to the first aspect, further comprising:

means for supplying pure water into a crucible.

A seventeenth aspect of the apparatus is an apparatus according to the sixteenth aspect, further comprising:

a bucket for containing said crucible which is deeper than said crucible; and means for moving said crucible out of said bucket.

An eighteenth aspect of the apparatus is an apparatus according to the sixteenth aspect, further comprising:

a tube for covering the inner sidewall of said crucible; and means for moving said tube upward and downward within a predetermined range.

a nineteenth aspect of the method of feeding raw material into a crucible before pulling silicon single crystal from the crucible by the CZ method is a method of the present invention, comprising the steps of:

filling a crucible with pure water; and feeding lump polycrystalline silicon as raw material into said pure water.

A twentieth aspect of the method of feeding raw material into a crucible before pulling silicon single crystal from the crucible by the CZ method is a method of the present invention, comprising the steps of:

disposing a crucible into a bucket deeper than said crucible;

filling said crucible and said bucket with pure water; and feeding lump polycrystalline silicon into said crucible.

A twenty first aspect of the method is a method according to the nineteenth aspect, further comprising:

feeding small piece-shaped or grain-shaped of polycrystalline silicon or their mixture with a predetermined thickness on the bottom of said crucible before feeding said lump polycrystalline silicon.

A twenty second aspect of the method is a method according to the nineteenth aspect, further comprising:

feeding piece-shaped or sherbet-shaped ices or their mixture made of pure water into said crucible before feeding said lump polycrystalline silicon.

A twenty third aspect of the method is a method according to the nineteenth aspect, further comprising:

feeding piece-shaped or grain-shaped polycrystalline silicon or their mixture, and piece-shaped or sherbet-shaped ices or their mixture made of pure water into said crucible before feeding said lump polycrystalline silicon.

A twenty fourth aspect of the method is a method according to the nineteenth aspect, further comprising:

covering the inner sidewall of said crucible with a tube which can be freely moved upward and downward; and moving said tube out of said crucible upon the end of feeding said lump polycrystalline silicon, or raising the tube corresponding to the process of feeding said lump polycrystalline silicon and moving said tube out of said crucible completely upon ending the feeding of said lump polycrystalline silicon.

A twenty fifth aspect of the method is a method according to the nineteenth aspect, further comprising:

drying said polycrystalline silicon and said crucible after feeding lump polycrystalline silicon as raw material. ilicon as raw material.

To achieve the above object, a first apparatus according to this invention, for feeding raw material into a quartz crucible is used for feeding polycrystalline silicon into a quartz crucible before manufacturing silicon single crystal by the CZ method, which is characterized in that: it comprises means for feeding polycrystalline silicon lumps into the quartz crucible; means for covering the inner wall surface of the quartz crucible with any one or a mixture of those selected from the group of pieces of polycrystalline silicon, grains of polycrystalline silicon, pure-water snow, pure-water ice pieces, or pure-water ice; means for draining the liquid melted from any one or a mixture of those selected from the group of the above pure-water snow, the above pure-water ice pieces, or the above pure-water ice from the quartz crucible; means for drying the quartz crucible and the polycrystalline silicon fed into the quartz crucible; and means for rotating and transporting the quartz crucible.

Raw material of silicon single crystal, namely, polycrystalline silicon can be automatically deposited into the quartz crucible without hand operation. Since pieces of polycrystalline silicon, grains of polycrystalline silicon, pure-water snow, pure-water ice pieces, or pure-water ice is disposed between the inner wall surface of the quartz crucible and polycrystalline silicon lumps as shock-absorption material, the shock imposing on the quartz crucible during the feeding of the polycrystalline silicon lumps could be absorbed. In addition to the means for feeding polycrystalline silicon lumps, the raw material feeding apparatus according to this invention is provided with the above means for feeding shock-absorption material, therefore the breakage of the quartz crucible can be avoided. In addition, after raw material has been fed into the quartz crucible, pure-water snow, or pure-water ice pieces is brought to melt into water and expelled out of the quartz crucible. Afterwards, the quartz crucible is conveyed into raw material drying device to dry them together with raw material.

Furthermore, a second apparatus according to this invention, for feeding raw material into a quartz crucible is characterized in that: further to the above first apparatus for feeding raw material into the quartz crucible, a resin tube capable of loosely covering the inner sidewall of the quartz crucible; means for moving up and down the above resin tube within a preset magnitude; and means for rotating the above resin tube at a speed equivalent to that of the quartz crucible are respectively provided.

In the above apparatus for feeding raw material into a quartz crucible, a shock-absorption means for absorbing the shock imposing on the inner sidewall surface of the quartz crucible during the feeding of the polycrystalline silicon lumps is the above resin tube. The above resin tube descends so as to cover the inner sidewall surface of the quartz crucible during feeding the polycrystalline silicon lumps. Also, the above resin tube is rotated at a speed equivalent to that of the quartz crucible, therefore no friction is incurred between the inner sidewall surface of the quartz crucible and the polycrystalline silicon lumps fed thereinto.

Furthermore, further to the above first and second apparatuses for feeding raw material into the quartz crucible, means for moving up and down the feeding means and the covering means within a preset magnitude and moving them in the horizontal direction reciprocally is further provided. The feeding means is used for feeding polycrystalline silicon lumps into the quartz crucible. The covering means is used for covering the inner wall surface of the quartz crucible with any one or a mixture of those selected from the group of pieces of polycrystalline silicon, grains of polycrystalline silicon, pure-water snow, pure-water ice pieces, or pure-water ice.

Moving up and down the means for covering the inner wall surface of the quartz crucible with piece/grain raw material, snow, ice pieces, or pure-water ice, moving the covering means in the horizontal direction reciprocally, and rotating the quartz crucible keeps the above shock-absorption material covering the inner wall surface of the quartz crucible with an even thickness. This can protect the quartz crucible from the impact induced by dropping of the polycrystalline silicon lumps in a subsequent process. Also, moving up and down the means for feeding polycrystalline silicon lumps into the quartz crucible, moving it in the horizontal direction reciprocally, and rotating the quartz crucible enables the polycrystalline silicon lumps to be fed in a dense manner the same as that done by hands conventionally.

In order to automatically drive each of the above mentioned means, the apparatus for feeding raw material into a quartz crucible in accordance with this invention is characterized in that: means for automatically controlling each of the above mentioned means is provided.

In the first and second apparatuses for feeding raw material into a quartz crucible in accordance with this invention, the entire process of feeding polycrystalline silicon lumps, covering the quartz crucible with shock-absorption material prior to feeding the polycrystalline silicon lumps, and treating the polycrystalline silicon subsequent to feeding the polycrystalline silicon can be automatically controlled.

Furthermore, this invention is characterized in that: in the apparatus for feeding raw material into a quartz crucible, the insert port for inserting an draining hose into the quartz crucible so as to expel the liquid melted from any one or a mixture of those selected from the group of pure-water snow, pure-water ice pieces, or pure-water ice out of the quartz crucible is a polycrystalline silicon pipe or a single-crystal silicon pipe with a purity essentially the same as that of polycrystalline silicon lumps. Alternatively, the above insert port is sheathed by a polycrystalline silicon pipe or a single-crystal silicon pipe with a purity essentially the same as that of polycrystalline silicon lumps.

According to the above structure, at least the insert port of the draining hose used for draining water out of the quartz crucible is a polycrystalline silicon pipe or a single-crystal silicon pipe with a purity essentially as same as that of the raw material fed into the quartz crucible, or the insert port is sheathed by a polycrystalline silicon pipe or a single-crystal silicon pipe. Therefore, when the draining hose is pulled out from the quartz crucible subsequent to the draining of water, the friction between the pipe and the raw material fed into the quartz crucible will not produce impurities.

A method of feeding raw material into a quartz crucible by using pure-water snow or pure-water ice as a shock-absorption material is characterized in that: before manufacturing silicon single crystal by the CZ method, in the process of feeding polycrystalline silicon lumps into the quartz crucible, the inner wall surface of the quartz crucible is covered with any one or a mixture of those selected from the group of pieces of polycrystalline silicon, grains of polycrystalline silicon, pure-water snow, pure-water ice pieces, or pure-water ice; then polycrystalline silicon lumps is deposited into the quartz crucible; subsequently pure water or hot pure water is poured into the polycrystalline silicon lumps to melt the snow, ice pieces left therein so as to expel water out of the quartz crucible after the polycrystalline silicon lumps has been deposited a preset amount; thereafter the quartz crucible and the polycrystalline silicon lumps fed into the quartz crucible are brought to dry.

By employing the above method, the shock during the feeding of the polycrystalline silicon lumps could be absorbed by the snow, ice pieces which is covering the inner wall surface of the quartz crucible; or absorbed by the mixture of pieces of polycrystalline silicon, grains of polycrystalline silicon, snow, or ice pieces which is tightly packed on the bottom of the quartz crucible. Therefore, the breakage of the quartz crucible can be prevented. Furthermore, pure water or hot pure water is poured into the polycrystalline silicon lumps to melt the remained snow, ice pieces after the polycrystalline silicon lumps has been fed a preset amount, therefore impurities sticking on raw material can be washed off and expelled out of the quartz crucible. Furthermore, after draining the water containing the above impurities, if the quartz crucible and the polycrystalline silicon lumps fed into the quartz crucible are brought to dry, then the single-crystal manufacturing device employing the CZ method is ready to be operated.

In the first method for feeding raw material into a quartz crucible by using snow and ice as a shock-absorption material is characterized in that: in the process of feeding raw material into the quartz crucible, the inner wall surface of the quartz crucible is covered with any one or a mixture of pure-water snow, or pure-water ice pieces, or the bottom of the quartz crucible is tightly packed with any one or a mixture of pieces of polycrystalline silicon or grains of polycrystalline silicon; then the inner wall surface of the quartz crucible is covered with any one or a mixture of pure-water snow or pure-water ice pieces.

According to the above method, then the inner wall surface of the quartz crucible is covered by pure-water snow, pure-water ice pieces, pieces of polycrystalline silicon, or grains of polycrystalline silicon, therefore the shock during the feeding of the polycrystalline silicon lumps could be completely absorbed.

In the second method for feeding raw material into a quartz crucible by using snow and ice as a shock-absorption material is characterized in that: the inner sidewall surface of the quartz crucible is covered by a link shaped pure-water ice which is inserting thereinto.

According to the second method for feeding raw material into a quartz crucible, the protection to the inner sidewall surface of the quartz crucible is enhanced, therefore the impact imposing on the inner sidewall surface of the quartz crucible could be impeded when the polycrystalline silicon lumps is fed into the quartz crucible.

In the third method for feeding raw material into a quartz crucible by using snow and ice as a shock-absorption material is characterized in that: the entire inner wall surface of the quartz crucible is covered by pure-water ice, or alternatively the entire inner wall surface of the quartz crucible is covered by pure-water ice and additionally any one or a mixture of those selected from pieces of polycrystalline silicon, grains of polycrystalline silicon, pure-water snow, or pure-water ice pieces is tightly packed over the above pure-water ice; then polycrystalline silicon lumps is fed into the quartz crucible.

According to the third method, an integrally formed pure-water ice covers the entire inner wall surface of the quartz crucible, therefore the ice reaching melting temperature and the water layer produced between the ice and the quartz crucible can be used as a shock-absorption material. Pure-water snow, pure-water ice pieces, pieces of polycrystalline silicon, or grains of polycrystalline silicon can be tightly packed on the integrally formed pure-water ice. Therefore, the impact imposing on the quartz crucible could be absorbed by the ice and the water layer, the snow, or the ice pieces when the polycrystalline silicon lumps is fed into the quartz crucible. Accordingly, the quartz crucible could be protected from the impact.

In the fourth method for feeding raw material into a quartz crucible by using snow and ice as a shock-absorption material is characterized in that: the bottom of the quartz crucible is covered with any one or a mixture of pieces of polycrystalline silicon, grains of polycrystalline silicon, pure-water snow, or pure-water ice pieces; then the inner sidewall of the quartz crucible is covered with a resin tube capable of moving up and down without restraint.

According to the fourth method, pieces of polycrystalline silicon, grains of polycrystalline silicon, pure-water snow, or pure-water ice pieces protect the bottom of the quartz crucible, and the resin tube protects the inner sidewall of the quartz crucible. Therefore, the impact imposing on the quartz crucible could be completely impeded when the polycrystalline silicon lumps is fed into the quartz crucible.

The fifth method for feeding raw material into a quartz crucible is characterized in that: in the fourth method, the bottom of the quartz crucible is covered with any one or a mixture of pieces of polycrystalline silicon, grains of polycrystalline silicon, pure-water snow, or pure-water ice pieces; then the inner sidewall of the quartz crucible is covered with a resin tube capable of moving up and down without restraint; at the end of feeding polycrystalline silicon lumps, the resin tube is withdrawn from the quartz crucible, or alternatively the resin tube is gradually raised in response to the progress of the feeding of the polycrystalline silicon lumps, and the resin tube is completely withdrawn from the quartz crucible at the end of feeding the polycrystalline silicon lumps.

According to the fifth method, the bottom of the quartz crucible is covered with pieces of polycrystalline silicon, grains of polycrystalline silicon, pure-water snow, or pure-water ice pieces, and the inner sidewall of the quartz crucible is covered with a resin tube, then polycrystalline silicon lumps is fed into the quartz crucible. The resin tube can be withdrawn from the quartz crucible at the end of feeding the polycrystalline silicon lumps. If the latter of the above two methods is taken, since the resin tube is gradually raised in response to the progress of feeding the polycrystalline silicon lumps, the friction incurred between the resin tube and the polycrystalline silicon lumps is very small. Furthermore, the resin tube can be completely withdrawn from the quartz crucible at the end of feeding the polycrystalline silicon lumps.

Furthermore, a process of feeding raw material into a quartz crucible without using snow and ice as a shock-absorption material is characterized in that: before manufacturing silicon single crystal by the CZ method, in the process of feeding polycrystalline silicon lumps into the quartz crucible, the bottom of the quartz crucible is tightly packed with any one or a mixture of pieces of polycrystalline silicon or grains of polycrystalline silicon; then the resin tube is gradually raised in response to the progress of feeding the polycrystalline silicon lumps, and the resin tube is completely withdrawn from the quartz crucible at the end of feeding the polycrystalline silicon lumps.

According to the above method, pieces of polycrystalline silicon or grains of polycrystalline silicon protect the bottom of the quartz crucible, and the resin tube protects the inner sidewall of the quartz crucible. Therefore, like those employing snow/ice pieces as a shock-absorption material, the same effect can be obtained. In addition, treatments such as draining water and drying are not necessary subsequent to the feeding of raw material.

In order to attain the above-mentioned object, the third apparatus for feeding raw material into a quartz crucible according to the invention is characterized in that: pure water is poured into a quartz crucible; piece-shaped ices, sherbet-shaped ices or their mixture made of pure water is fed into the quartz crucible; small piece-shaped polycrystalline silicon, grain-shaped polycrystalline silicon or their mixture is fed into the quartz crucible; lump polycrystalline silicon is loaded into the quartz crucible; and the quartz crucible and polycrystalline silicon inside the quartz crucible are dried.

The polycrystalline silicon material can be rapidly fed into the quartz crucible without the use of man-hand. Full pure water, piece-shaped or grain-shaped polycrystalline silicon, piece-shaped ices floating on the pure water, etc. function as buffer materials of the lump polycrystalline silicon. In addition to lump polycrystalline silicon fed, those buffer materials mentioned above are fed in the invention, so impacts caused by the falling lump polycrystalline silicon can be alleviated, and damages to the quartz crucible can be prevented. After feeding the raw material, the quartz crucible and polycrystalline silicon inside the quartz crucible are dried.

The fourth apparatuses according to this invention are characterized in that: a bucket for containing a quartz crucible is deeper than the quartz crucible; and means for moving the quartz crucible out of the bucket is provided.

The quartz crucible is contained in the bucket higher than the quartz crucible. Then,the quartz crucible and bucket are filled with pure water and the horizon of the pure water is over the top of the quartz crucible. That is, since pure water layer exits over the top of the quartz crucible, the buffer effect becomes larger especially in second-half period of feeding lump polycrystalline silicon.

The fifth apparatus for feeding raw material into a quartz crucible according to this invention is further characterized in that: a tube for surrounding the inner sidewall of the quartz crucible is provided; and means for moving the tube upward and downward within a predetermined range is provided.

In the third apparatus for feeding raw material into a quartz crucible, the tube is used to moderate impacts against the inner sidewall of the quartz crucible when feeding the lump polycrystalline silicon. Since the tube is lowered and has completely covered the inner sidewall of the quartz crucible before feeding the lump polycrystalline silicon, there are no damages on the sidewall of the quartz crucible.

Next, the fifth method for feeding raw material into a quartz crucible according to the invention is characterized in that: before manufacture of single-crystal silicon, a quartz crucible is completely filled with pure water; and then lump polycrystalline silicon is fed into the pure water.

Since this method is the basis of the methods for feeding raw material into a quartz crucible of the invention, the pure water is used as a buffer material when feeding the lump polycrystalline silicon. Due to buoyancy of the pure water causing the weight of the lump polycrystalline silicon which is falling into the quartz crucible full of the pure water to be reduced to about 60% of its original weight, impacts caused by the falling lump polycrystalline silicon can be moderated, and therefore, damages to the quartz crucible can be prevented. Moreover, contamination substances stuck on the surfaces of the polycrystalline silicon can be removed by feeding the polycrystalline silicon into the pure water.

Furthermore, the sixth method for feeding raw material into a quartz crucible according to the invention is characterized in that: prior to manufacture of single-crystal, a quartz crucible is inserted into a bucket deeper than the quartz crucible; the quartz crucible and bucket are completely filled with pure water; and lump polycrystalline silicon is fed into the quartz crucible.

The quartz crucible is contained in the bucket higher than the quartz crucible. Then, the quartz crucible and bucket are fully filled with pure water, and the horizontal level of the pure water is over the top of the quartz crucible. Under this condition, since the falling lump polycrystalline silicon is applied with buoyancy in the last process of feeding raw material, impacts caused by the falling lump polycrystalline silicon can be moderated.

The seventh method for feeding raw material into quartz crucible according to the invention is further characterized in that: small piece-shaped or grain-shaped polycrystalline silicon or their mixture with a predetermined thickness is disposed on the bottom of the quartz crucible before feeding the lump polycrystalline silicon.

In the seventh method, since the bottom of the quartz crucible is previously covered by the small piece-shaped and/or grain-shaped polycrystalline silicon, impacts of the falling lump polycrystalline silicon directly to the bottom of the quartz crucible can be prevented. Therefore, the bottom of the quartz crucible can be efficiently protected.

The eighth method for feeding raw material into a quartz crucible according to the invention is characterized in that: piece-shaped or sherbet-shaped ices or their mixture made of pure water is fed into the quartz crucible before loading the lump polycrystalline silicon.

The above-mentioned ices made of pure water, floating on the surface of the pure water, functions as the first buffer material. Moreover, in the last process of feeding raw material, even though the final amount of the pure water is decreased, the floating ices can also functions as a buffer material.

The ninth method for feeding raw material into a quartz crucible according to the invention is characterized in that: piece-shaped or grain-shaped polycrystalline silicon or their mixture, and piece-shaped or sherbet-shaped ices or their mixture made of pure water are fed into the quartz crucible fore feeding the lump polycrystalline silicon.

Since the ninth method for feeding raw material into quartz crucible is combination of the third and fourth methods, the quartz crucible can be well protected from damages from the beginning to the end of the falling lump polycrystalline silicon.

The tenth method for feeding raw material into a quartz crucible is characterized in that, the inner sidewall of the quartz crucible is covered with a tube which can freely move upward and downward before feeding the lump polycrystalline silicon; and the tube is separated with the quartz crucible upon the end of feeding the lump polycrystalline silicon, or the tube is raised corresponding to the process of feeding the lump polycrystalline silicon and the tube is completely moved out of the quartz crucible upon ending the feeding of the lump polycrystalline silicon.

In the tenth method, since the inner sidewall of the quartz crucible is well protected by the tube during feeding raw material, the inner sidewall cannot be harmed by impacts caused by the falling lump polycrystalline silicon. Even though the tube is completely separated with the quartz crucible by the use of above-mentioned two methods after the feeding raw material is finished, since the tube is pulled up slowly by the latter method corresponding to the process of feeding lump polycrystalline silicon, frictions between the tube and lump polycrystalline silicon are minimized, and therefore, impurities falling into the quartz crucible can be prevented.

According to these methods, after feeding a predetermined amount of polycrystalline silicon into the quartz crucible, the polycrystalline silicon and quartz crucible are dried.

BRIEF DESCRIPTION OF THE DRAWINGS

The present invention can be more fully understood by reading the subsequent detailed description and examples with reference made to the accompanying drawings, wherein.

DETAILED DESCRIPTION OF THE PREFERRED EMBODIMENTS

Figure 1:
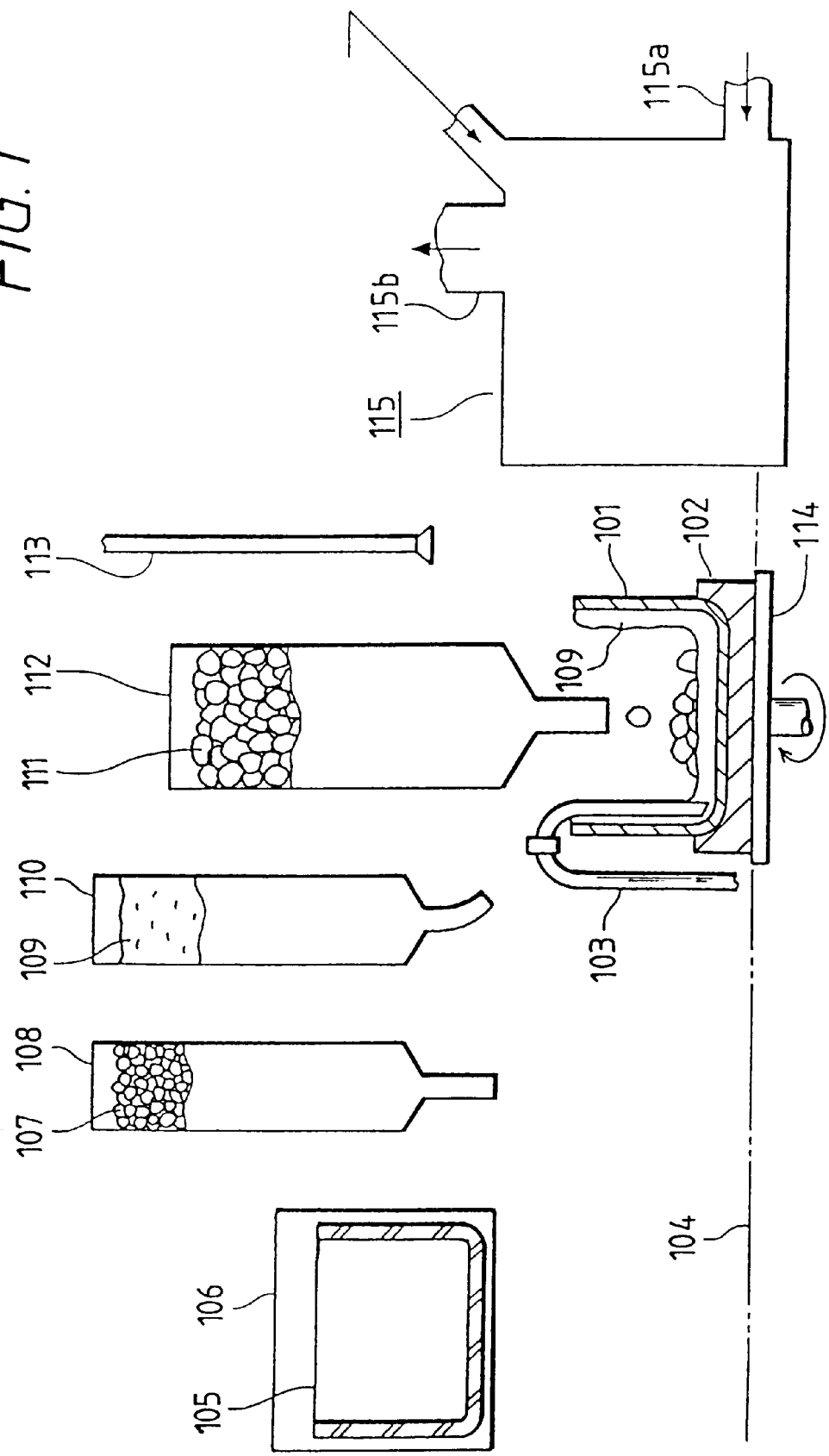
FIG. 1 is a schematic illustration showing a method and an apparatus for feeding raw material into a quartz crucible according to a first embodiment.

The following is a description of an embodiment of the method for feeding raw material into a quartz crucible according to this invention, with references being made to the accompanying drawings. FIG. 1 is a schematic illustration showing a method and an apparatus for feeding raw material into a quartz crucible according to a first embodiment. As shown in FIG. 1, a quartz crucible 101 is steadily installed on a support table 102, and a draining hose 103 having is extending along the inner wall of the quartz crucible 101. The quartz crucible 101, the draining hose 103, and a draining hose raising/lowering device (not shown) are capable of being moved on a conveying device 104. Above the conveying device 104, a container 106 used for refrigerating ice baskets 105 formed by freezing pure-water or ring shaped ice (will be described hereinafter); a container 108 used for storing pieces of polycrystalline silicon, grains of polycrystalline silicon, or their mixture (hereinafter referred as piece/grain raw material 107); a container 110 used for storing pure-water snow, pure-water ice pieces, or their mixture (hereinafter referred as snow/ice pieces 109); a container 112 used for storing polycrystalline silicon lumps (hereinafter referred as lump material 111); and a discharging hose 113 used for discharging heated pure water are disposed on the conveying device 104 in such a manner that each is capable of moving up and down without restraint. The above ice baskets 105 are of a thickness of 2–3 cm and capable of being fixed within the quartz crucible 101. Although not shown in FIG. 1, the above ring shaped ice is of a cylindrical shape and capable of being inserted into the quartz crucible 101. The ring shaped ice is capable of covering only the inner sidewall of the quartz crucible 101.

A plurality of turntables 114 are disposed on the conveying device 104, each is located below each of the container 108, the container 110, and the container 112. The quartz crucible 101 conveyed and installed on each turntable 114 can be rotated together with each corresponding turntable 114. Furthermore, the container 108, the container 110, and the container 112 are capable of moving in the horizontal direction reciprocally within some extent and in synchronization with the rotating motion of each corresponding turntable 114 located therebelow.

A microwave oven 115 used for drying the quartz crucible 101 and the raw material fed thereinto is disposed on the down-stream side of the discharging hose 113. The microwave oven 115 can accommodate and heat both of the quartz crucible 101 and the support table 102. The microwave oven 115 is provided with an air introducing port 115a for introducing flitted clean air and an air expelling port 115b for expelling water-containing air. The conveying device 104 is passing by the microwave oven 115 and extending to a preset location near a single-crystal manufacturing device.

The conveying and the stopping of the quartz crucible 101; the raising and the lowering of the container 106, the container 108, the container 110, the container 112, the discharging hose 113, and the draining hose 103; the reciprocal motions in the horizontal direction of the container 108, the container 110, and the container 112; the beginning and stopping of the discharging of the content stored in each container; the rotating and the stopping of each turntable 114; and the beginning and stopping of the operation of discharging water, draining water, and the microwave oven 115 are respectively controlled basing on instruction signals coming from a control device (not shown).

The above-described devices were listed on the purpose of satisfying all of the several methods described below. It should be noted that in some methods for feeding raw material certain devices could be omitted.

Figure 2:
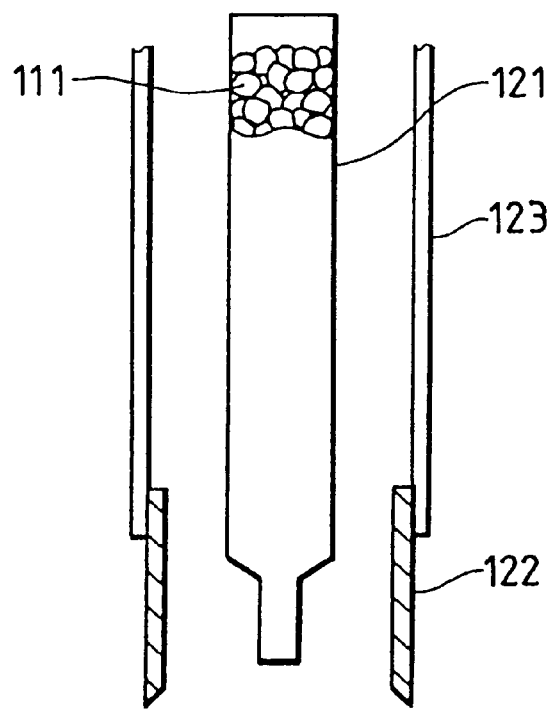
FIG. 2 is a schematic illustration showing an apparatus for feeding raw material into a quartz crucible according to a second embodiment.
Figure 3:
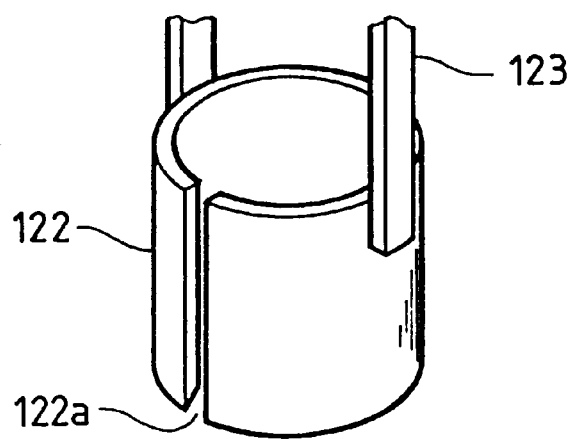
FIG. 3 is a perspective view showing the structure of a resin tube.

FIG. 2 is a schematic illustration showing part of an apparatus for feeding raw material into a quartz crucible according to the second embodiment. FIG. 3 is a perspective view showing the structure of a resin tube used for covering the inner sidewall of a quartz crucible. Instead of the container 121 used for storing lump material 111 shown in FIG. 1, the apparatus for feeding raw material is provided with a container 121 and a resin tube 122 which is surrounding the container 121 and capable of moving up and down without restraint. Same as the container 121, the container 121 is capable of ascending, descending and moving in the horizontal direction reciprocally. The resin tube 122 is a cylinder capable of loosely covering the inner sidewall of the quartz crucible when it descends, and is made of the same material as that of the bags packing the lump material 111. A slit 122a used for avoiding interfering with the draining hose 103 shown in FIG. 1 is formed in the resin tube 122 which is affixed to two supporting rods 123. Furthermore, the resin tube 122 is capable of being rotated in synchronization with the rotating motion of the quartz crucible. Other devices constructing the apparatus for feeding raw material are the same to those shown in FIG. 1, and their description is thus omitted.

Figure 4:
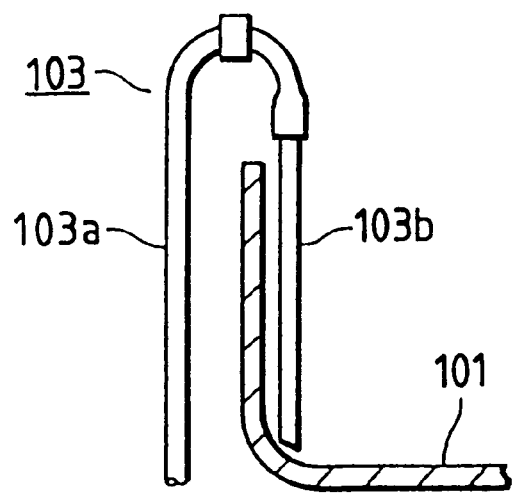
FIG. 4 is a schematic illustration showing the structure of a draining hose according to a first embodiment.

FIG. 4 is a schematic illustration showing the structure of a draining hose according to a first embodiment related to a draining hose. The draining hose is installed in the quartz crucible prior to feeding operation and is used for draining the water left in the quartz crucible. The water is melted from the snow and ice that is employed as shock-absorption material when lump material is loaded into the quartz crucible. The hose 103 includes a resin hose body 103a, and a polycrystalline silicon pipe or a single-crystal silicon pipe 103b (hereinafter referred as silicon pipe) connected to the hose body 103a and is of a purity essentially the same as that of polycrystalline silicon lumps. The silicon pipe 103b is somewhat longer than the depth of the quartz crucible 101. By employing the draining hose 103 having the above structure, only silicon pieces or silicon debris, which are produced at the time of feeding lump material or produced by the scratching between the draining hose 103 and lump material during withdrawing the draining hose 103 from the quartz crucible 101, are left within the quartz crucible 101. Therefore, destructive influence will not brought on the lifting operation of single crystals. Furthermore, the silicon pipe 103b can also be left within the quartz crucible 101 when the hose body 103a is withdrawn from the quartz crucible 101.

Figure 5:
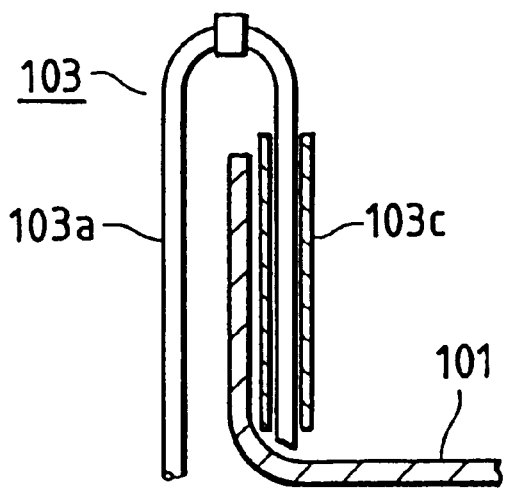
FIG. 5 is a schematic illustration showing the structure of a draining hose according to a second embodiment.

FIG. 5 is a schematic illustration showing the structure of a draining hose according to a second embodiment related to a draining hose. A silicon pipe 103c covers a portion of the resin-made hose body 103a, which portion is inserting into the quartz crucible 101. The draining hose 103 shown in FIG. 5 has the same effect as that of the first embodiment. At the beginning of withdrawing the draining hose 103, only the resin-made hose body 3a is withdrawn, then the silicon pipe 103c is withdrawn. It is also advisable that the silicon pipe 103c is left within the quartz crucible 101.

According to this invention, there are several methods for feeding raw material into the quartz crucible. Their descriptions are set forth consecutively. The method for feeding raw material into the quartz crucible according to the first embodiment is that damping the shock imposing on the quartz crucible during feeding lump material by employing pure-water snow/ice pieces. As shown in FIG. 1, the quartz crucible 101 installed on the support table 102 is capable of being conveyed between the container 106 and the container 108. Under that situation, the draining hose 103 is lowered and is disposed into the quartz crucible 101. The draining hose 103 is lowered until its one end reaches the bottom of the quartz crucible 101. Then, the quartz crucible 101 is conveyed onto the turntable disposed under the container 110. Thereafter, the container 110 is lowered to a preset location so as to spray snow/ice pieces 109 from the container 110 onto the inner wall of the quartz crucible 101. Meanwhile, the quartz crucible 101 together with the turntable is rotated, and the container 110 is driven to move in the horizontal direction reciprocally. Therefore, the inner wall of the quartz crucible 101 can be covered with a uniform-thick layer of snow/ice pieces 109. After the spray operation of snow/ice pieces 109, the container 110 ascends to its original location.

Thereafter, the quartz crucible 101 is conveyed onto the turntable 114 that is under the container 112, and the container 112 is lowered. Next, lump material is fed into the quartz crucible 101 through the container 112. The shock during feeding lump material is damped by the snow/ice pieces 109 sprayed onto the inner wall of the quartz crucible 101, and the breakage of the quartz crucible 101 can be prevented. Furthermore, the quartz crucible 101 together with the turntable 114 is rotated, and the container 112 is driven to move in the horizontal direction reciprocally. Therefore, lump material 111 can be uniformly fed into the quartz crucible 101, and lump material 111 can be tightly packed just like hand operation.

During spraying snow/ice pieces 109 onto the inner wall of the quartz crucible 101, snow/ice pieces 109 can be sprayed onto the inner sidewall from the lowermost location to uppermost location at one time. Alternatively, snow/ice pieces 109 is firstly sprayed from the lowermost location to a preset height, then repeats the same spray operation after every feeding of a preset amount of lump material.

After feeding a preset amount of lump material 111, the container 112 ascends to its original location and the quartz crucible 101 is conveyed to a location below the discharging hose 113. At the location below the discharging hose 113, pure water or heated pure water is discharged from the discharging hose 113 onto the lump material 111 so as to melt snow/ice pieces 109. Thereafter, a draining pump (not shown) is activated to drain out the water left in the quartz crucible 101 through the draining hose 103. Contamination substance stuck on lump material in the processes of packing, transporting, or opening the packages will be washed off by pure water that is drained out through the draining hose 103. After draining the water, the draining hose 103 automatically goes up and leaves the quartz crucible 101.

After that, the support table 102 together with the quartz crucible 101 fed with raw material is conveyed into the microwave oven 115 via the conveying device 104 and heated within a dust-removed air or nitrogen atmosphere. At that time, to prevent the occurrence of $SiO_2$ from lump material 111, heating temperature is controlled to avoid overheating. After removing water sticking on the quartz crucible 101 and lump material 111, the quartz crucible 101 is conveyed out of the microwave oven 115 and transported to a preset location near the single-crystal manufacturing device.

Figure 6:
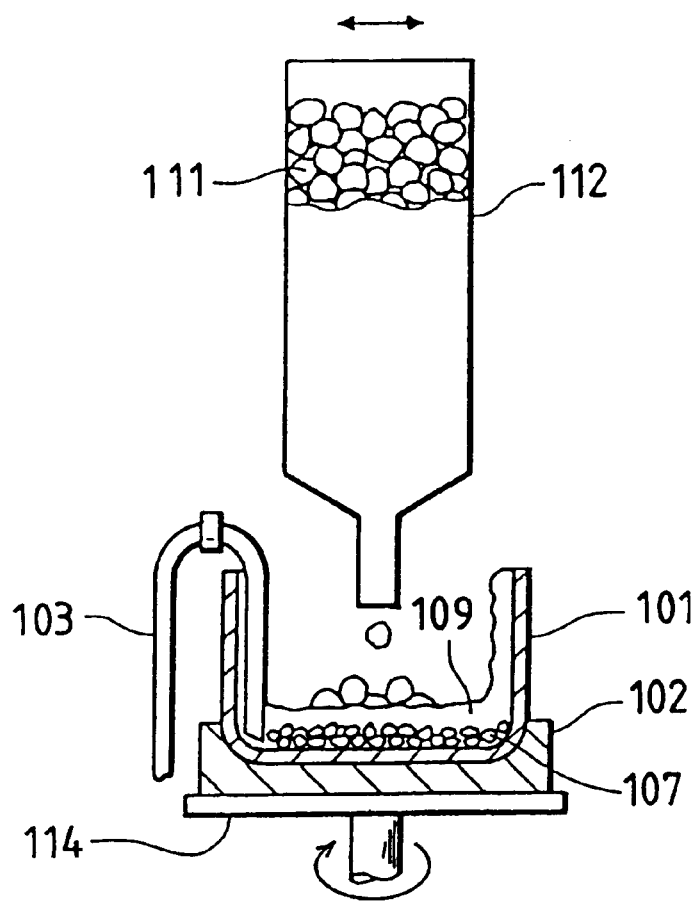
FIG. 6 is a schematic illustration showing another method for feeding raw material into a quartz crucible according to the first embodiment.

In the method for feeding raw material into a quartz crucible according to the first embodiment, it is also advisable that piece/grain raw material can be tightly packed on the bottom of the quartz crucible firstly, then snow/ice pieces is sprayed thereover. Under this circumstance, in the device for feeding raw material into a quartz crucible shown in FIG. 1, the quartz crucible 101 with the draining hose 103 installed thereon is conveyed under the container 108. At that time, the container 108 is lowered to a preset extent and moves in the horizontal direction reciprocally and the quartz crucible 101 together with the turntable is rotated, meanwhile a preset amount of piece/grain raw material 107 is fed. Therefore, piece/grain raw material 107 could be tightly packed on the bottom of the quartz crucible 101 with an essentially even thickness. Next, the container 108 ascends to its original location, and the quartz crucible 101 is conveyed to a location below the container 110, and snow/ice pieces 109 is sprayed over the above piece/grain raw material 107 and the inner sidewall of the quartz crucible 101. At that time, the quartz crucible 101 together with the turntable is also rotated, and the container 110 moves in the horizontal direction reciprocally during its ascending or descending movements. Therefore, snow/ice pieces 109 could be tightly packed over the piece/grain raw material 107 and the sidewall of the quartz crucible 101 with an essentially even thickness. Then, as shown in FIG. 6, the quartz crucible 101 is conveyed onto a turntable 114 that is disposed below the container 112. Thereafter, lump material 111 is fed into the rotating quartz crucible 101. In this embodiment, the protection on the bottom of the quartz crucible is extremely large. The treatment subsequent to the feeding of raw material is the same as that described in the first embodiment. The description is thus omitted.

Figure 7:
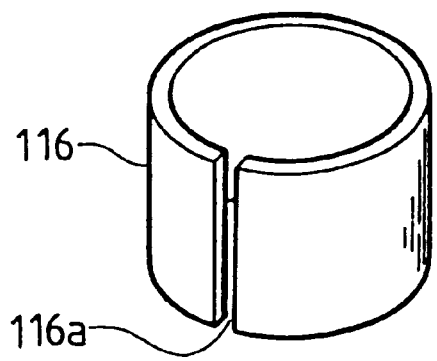
FIG. 7 is a perspective view showing the structure of a ring shaped ice used in the method for feeding raw material into a quartz crucible according to the second embodiment.
Figure 8:
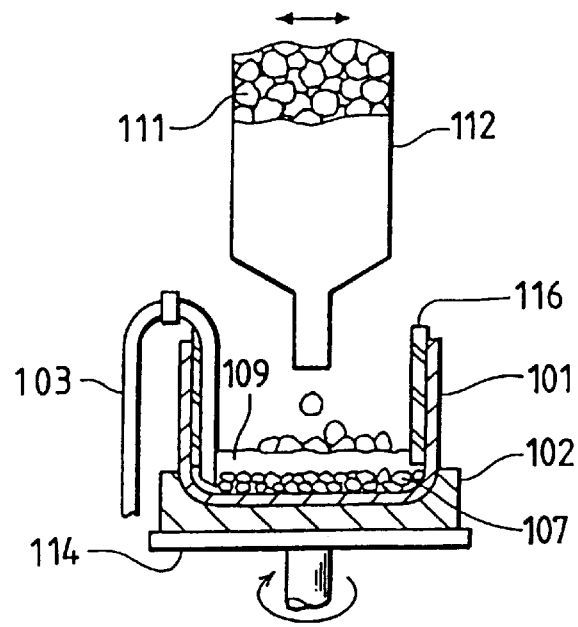
FIG. 8 is a schematic illustration showing the method for feeding raw material into a quartz crucible according to the second embodiment.

The method for feeding raw material into a quartz crucible according to the second embodiment is protecting the inner sidewall of the quartz crucible by a ring shaped pure-water ice. In the device for feeding raw material into a quartz crucible shown in FIG. 1, after installing the draining hose 103 on the quartz crucible 101, piece/grain raw material 107 is tightly packed on the bottom of the quartz crucible 101. Then, pure-water snow/ice pieces 109 are sprayed over the above piece/grain raw material 107 discharged from the container 110. Thereafter, the quartz crucible 101 is conveyed to a location below the container 106, and a ring shaped ice 116 as shown in FIG. 7 is discharged from the descended container 106. A slit 116a used for avoiding interfering with the draining hose 103 is formed in the ring shaped ice 116. After inserting into the quartz crucible 101, the ring shaped ice 116 descends along the inner sidewall and covers the inner sidewall of the quartz crucible 101 (see FIG. 8). Then, the quartz crucible 101 is conveyed to a location below the container 112, and lump material 111 stored in the container 112 is fed into the quartz crucible 101. At that time, the inner sidewall of the quartz crucible 101 is protected from the impact of lump material 111 by the above ring shaped ice 116. Furthermore, it is also suitable that, before inserting the ring shaped ice 116, instead of piece/grain raw material 107, snow/ice pieces 109 are directly sprayed onto the bottom of the quartz crucible. Furthermore, it is also acceptable to divide the ring shaped ice 116 into several sections along its longitudinal axis and to insert the sections into the quartz crucible in response to the amount of lump material fed. The treatment subsequent to the feeding of raw material is the same as that described in the first embodiment, and the description is thus omitted.

Figure 9:
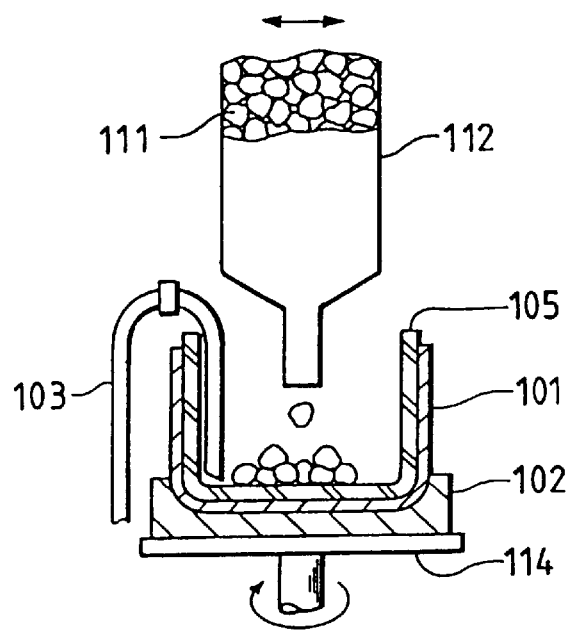
FIG. 9 is a schematic illustration showing the method for feeding raw material into a quartz crucible according to the third embodiment.

In the method for feeding raw material into a quartz crucible according to the third embodiment, the quartz crucible 101 is conveyed to and stopped at a location below the container 106 shown in FIG. 1. Then, an ice basket 105 descends from the container 106 and inserts into the quartz crucible 101. FIG. 9 is a schematic illustration showing the method for feeding raw material into a quartz crucible according to the third embodiment. As shown in FIG. 9, the draining hose 103 is lowered and installed after the ice basket 105 has been inserted. Then, the quartz crucible 101 is conveyed to a location below the container 112. At that time, the ice basket 105 has reached its melting temperature, and a layer of water is produced between the inner wall of the quartz crucible 101 and the outer wall of the ice basket 105. Namely, the ice basket 105 is in a state of floating on the quartz crucible 101.

Under this circumstance, the container 112 is lowered to feed lump material 111 into the ice basket 105. At that time, the container 112 moves in the horizontal direction reciprocally and the quartz crucible 101 together with the turntable 114 is rotated. Therefore, the whole lump material 111 can be fed into the ice basket 105. After feeding lump material 111, pure water is discharged from the discharging hose 113 onto lump material 111 to melt the ice basket 105. The subsequent treatment is the same as that described in the first embodiment, and the description is omitted.

Figure 10:
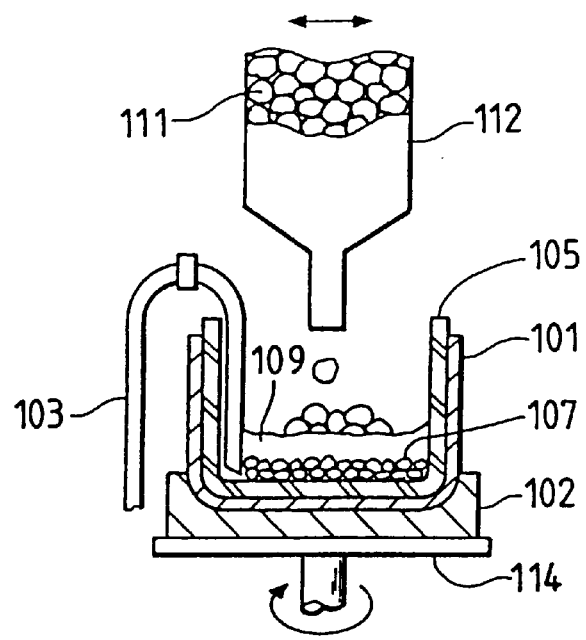
FIG. 10 is a schematic illustration showing another method for feeding raw material into a quartz crucible according to the third embodiment.

As shown in FIG. 10, in the method for feeding raw material into a quartz crucible according to the third embodiment, it is also advisable to tightly pack a preset amount of piece/grain raw material 107 stored in the container 108 firstly on the bottom of the ice basket 105 that is inserted into the quartz crucible 101 and floating thereon. Then, lump material 111 stored in the container 112 is fed after snow/ice pieces 109 stored in the container 110 has been sprayed over the above piece/grain raw material 107. Alternatively, it is acceptable to spray snow/ice pieces 109 firstly onto the inner surface of the ice basket 105 inserted into the quartz crucible 101, then to feed lump material 111. The treatment subsequent to the feeding of raw material is the same as that described in the first embodiment, and the description is thus omitted.

Furthermore, it is also satisfactory to reciprocally convey the quartz crucible 101 between two locations respectively below the containers 110, 112, and to alternatively feed snow/ice pieces 109 and lump material 111. This consecutive adding of shock-absorption material during the feeding of lump material 111 intensely impedes the impact incurred by dropping of lump material 111. Furthermore, it is also suitable to dispose the container 110 and the container 112 close to each other. By this arrangement, subsequent to spraying snow/ice pieces 109 onto the inner wall of the quartz crucible 101 with an even thickness, snow/ice pieces 109 can be consecutively sprayed during the feeding of the lump material 111.

Figure 11:
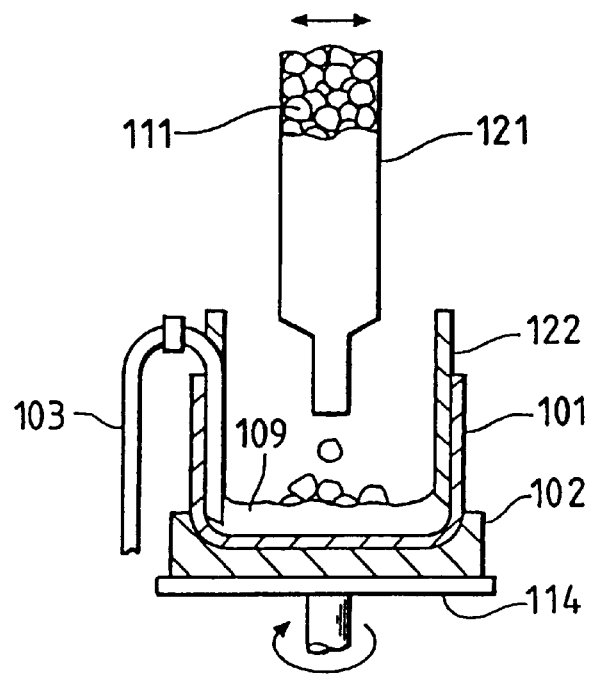
FIG. 11 is a schematic illustration showing the method for feeding raw material into a quartz crucible according to the fourth embodiment.

The method for feeding raw material into a quartz crucible according to the fourth embodiment is covering the inner sidewall of the quartz crucible with a resin tube. In the device or feeding raw material into a quartz crucible shown in FIG. 1, after installing the draining hose 103 on the quartz crucible 108, the container 110 is lowered to spray pure-water snow/ice pieces 109 onto the bottom of the quartz crucible 101. Alternatively, it is also satisfactory to lower the container 110 to cover the bottom of the quartz crucible 101 with piece/grain raw material 107, then spray pure-water snow/ice pieces 109 thereon. Thereafter, the quartz crucible 101 is conveyed to a location below the container 121 shown in FIG. 2, and the resin tube 122 surrounding the container 121 is lowered to insert into the quartz crucible 101 so as to cover the inner sidewall of the quartz crucible 101 (see FIG. 11). At that time, the draining hose 103 installed on the quartz crucible 101 is in alignment with the slit 122a formed in the resin tube 122. Therefore, the resin tube 122 can be inserted into the quartz crucible 101 without interfering with the draining hose 103.

Thereafter, the container 121 is lowered to a preset height to start feeding lump material 111. Meanwhile, the container 121 is driven to move in the horizontal direction reciprocally and the quartz crucible 101 together with the turntable 114 is rotated. Therefore, lump material 111 can be uniformly fed into the quartz crucible 101. Furthermore, the resin tube 122 is rotated in synchrony with the turntable 114; therefore no friction is incurred between the resin tube 122 and the lump material 111 fed into the quartz crucible 101. The bottom and the inner sidewall of the quartz crucible 101 are respectively covered by snow/ice pieces 109 and the resin tube 122. Therefore, both are protected from the impact induced by dropping of lump material 111, and they will not break during the feeding of lump material 111.

The resin tube 122 is gradually raised in response to the progress of the feeding of the lump material 111, and the resin tube 122 is completely withdrawn from the quartz crucible at the end of feeding the lump material 111. Then, the resin tube 122 ascends together with the container 121 to its original height. The treatment subsequent to the feeding of raw material is the same as that described in the first embodiment, and the description is thus omitted.

In the above-described embodiments, lump material and piece/grain raw material can be cleaned by pure water after feeding into the quartz crucible. Therefore, it is possible to remove most of the contamination brought into in the processes of packing, transporting, opening the packages, or even feeding lump material. Therefore, the problem incurred by unforeseen contamination that happened much more often than average can be solved. For example, the carbon content, the unforeseen contamination happened most often, can be substantially lowered to a level of 0.6, and the metal content can also be lowered to a level of 0.8.

The method for feeding raw material into a quartz crucible according to the fifth embodiment is covering the quartz crucible with a resin tube and piece/grain raw material without employing snow/ice pieces. The fifth embodiment is an application of the fourth embodiment. Before feeding lump material 111, the container 108 is lowered (see FIG. 1) to tightly pack piece/grain raw material 107 on the bottom of the quartz crucible 101. Thereafter, the quartz crucible 101 is conveyed to a location below the container 121 shown in FIG. 2, and the resin tube 122 surrounding the container 121 is lowered to insert into the quartz crucible 101 so as to cover the inner sidewall of the quartz crucible 101 (see FIG. 12). Then, the container 121 is lowered to a preset feeding height to start the feeding of lump material 111 just the same as in the above fourth embodiment. Piece/grain raw material 107 and the resin tube 122 respectively cover the bottom and the inner sidewall of the quartz crucible 101. Therefore, both are protected from the impact induced by dropping of lump material 111, and they will not break during the feeding of the lump material 111.

The resin tube 122 is gradually raised in response to the progress of the feeding of the lump material 111, and the resin tube 122 returns to its original height at the end of feeding the lump material 111. Meanwhile, the quartz crucible 101 fed with a preset amount of lump material 111 is conveyed to a preset location near the single-crystal manufacturing device.

Figure 12:
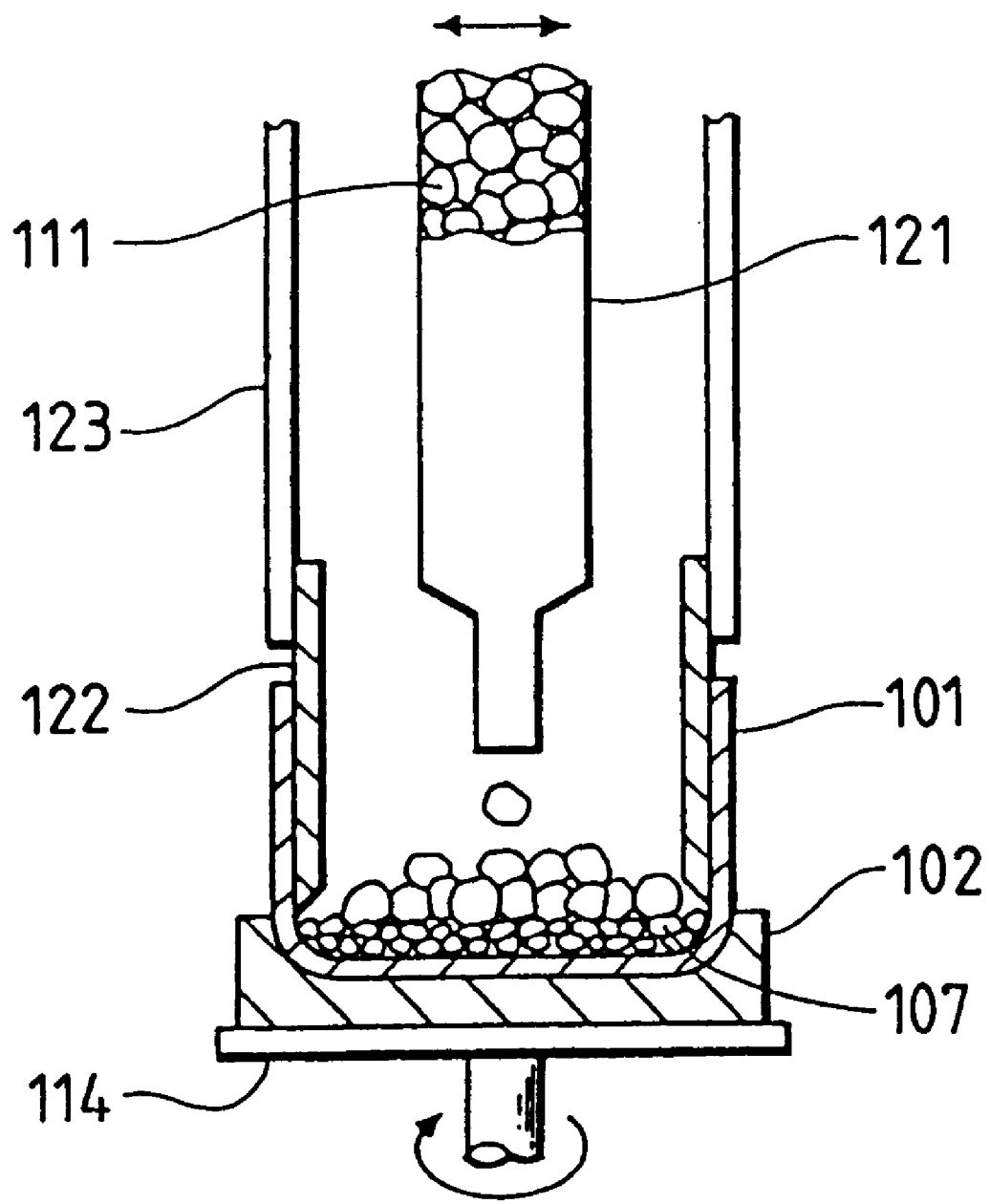
FIG. 12 is a schematic illustration showing the method for feeding raw material into a quartz crucible according to the fifth embodiment.

The method for feeding raw material into a quartz crucible according to the fifth embodiment is using piece/grain raw material only as a shock-absorption material without employing resin tubes. At this time, to impede the shock imposing on the inner sidewall of the quartz crucible during feeding lump material, the container 121 shown in FIG. 12 is lowered to its lowermost location and is moved in the horizontal direction reciprocally during the feeding operation. Thereafter, the container 121 is gradually raised in response to the progress of the feeding of the lump material. By this arrangement, lump material is placed into the rotating quartz crucible without imposing any impact, and the breakage of the quartz crucible can thus be avoided.

Conventionally, the operation of feeding raw material into a quartz crucible is performed by hand operation and is time-consuming. According to this invention, it can be performed automatically by employing apparatuses with simple structures. Therefore, the operation of feeding raw material into a quartz crucible can be expedited and becomes laborsaving. Furthermore, in the process of feeding raw material, in addition to using pure-water snow and ice, heated pure water is poured to wash off contamination substance stuck on raw material. Therefore, the quality of silicon single crystals produced can be enhanced. Furthermore, in the process of feeding raw material into a quartz crucible without using snow or ice, the structure of the apparatuses is very simple and low cost. In light of the above, this invention is very contributive to the enlargement of silicon single crystals produced by the CZ method.

Figure 13:
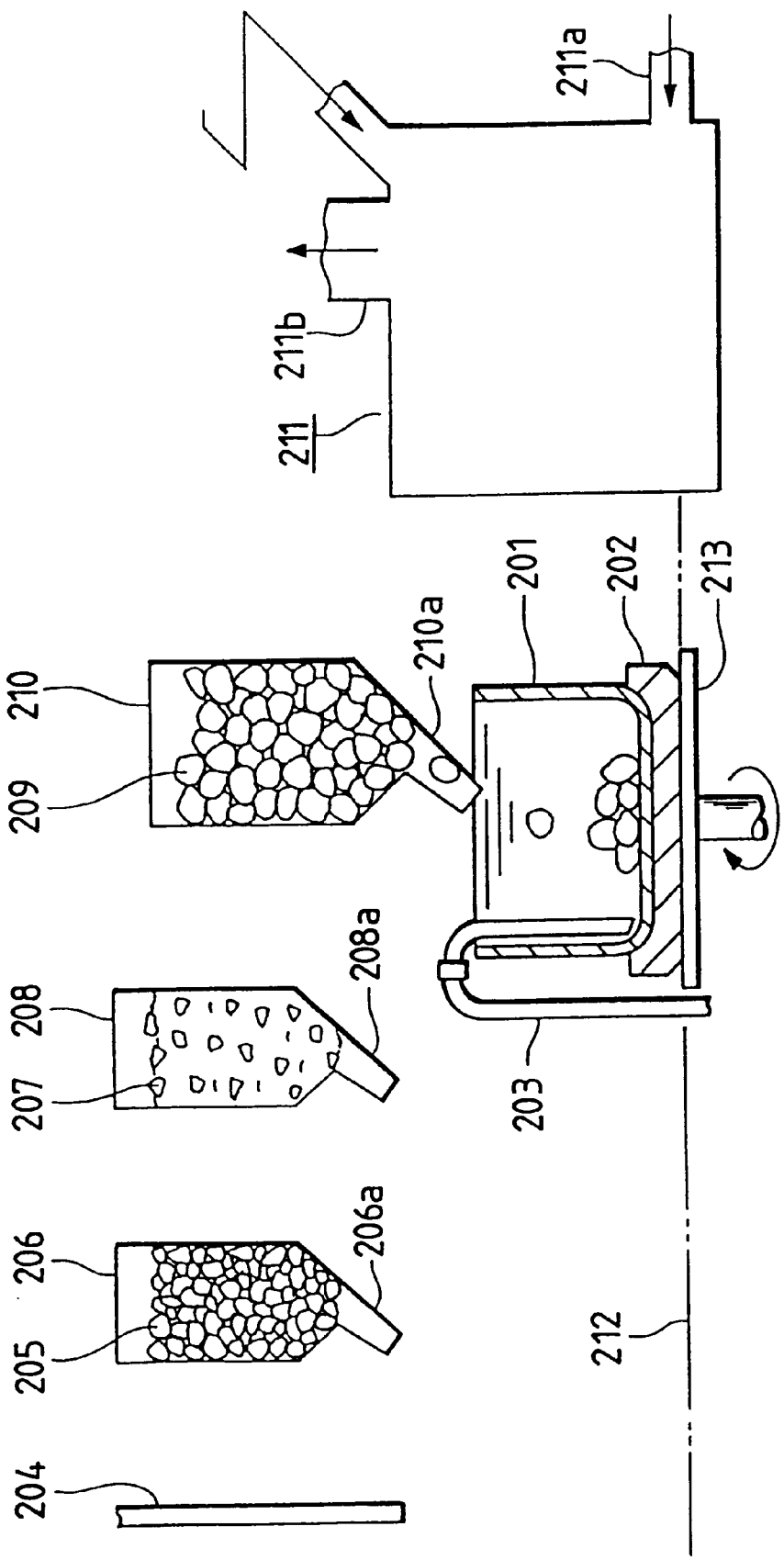
FIG. 13 is a schematic view illustrating an apparatus for feeding raw material according to the first embodiment of the invention.

The embodiments of the present invention will be clearly described, accompanying with pertinent drawings. Referring to FIG. 13, a schematic view shows an apparatus for feeding raw material according to the sixth embodiment of the invention. A quartz crucible 201 is steadily disposed on a support table 202. The apparatus for feeding raw material comprises means for raising/lowering a draining hose 203 with a length, one end of which is able to reach the bottom of the quartz crucible along inner sidewall thereof, a water supply hose 204 for supplying pure water, a container 206 for storing small piece-shaped, grain-shaped polycrystalline silicon or their mixture 205, a container 208 for storing piece-shaped ices, sherbet-shaped ices or their mixture 207 made of pure water, a container 210 for storing lump polycrystalline silicon 209, a microwave oven 211 for containing and drying the quartz crucible in which a predetermined amount of raw material is fed and a conveyer 212 for carrying the quartz crucible. There are guide tubes 206a, 208a, 210a at the bottoms of the containers 206, 208, 210, respectively. Moreover, the microwave oven 211 has an inlet 211a for guiding filtered pure air in and an outlet for discharging air containing moisture.

In order to drain the quartz crucible 201 to serve as an assistant means for rapidly drying raw material fed into the quartz crucible, the draining hose 203 connected to a pump (not shown) is installed. Furthermore, the designed conveyer 212 is expected to stretch from the downside of the water supply hose 204 to microwave oven 211, in particular from microwave oven 211 to around an apparatus for manufacturing singlecrystal (not shown). The container 206, 208, 210 can be moved upward and downward. A freely rotatable turn table 213 is installed on the conveyer 212 under the containers. The quartz crucible 201 can be rotated together with the support table 202 on the turn table 213.

The conveying and stopping of the quartz crucible 201, the raising and lowering of the water supply hose and containers 206,208,210, the starting and stopping of discharging the content stored in each container, starting and stopping of the turn table 213, the beginning and stopping of operations of supplying water, draining water and the microwave oven 211 are respectively controlled by instruction signals coming from a control device (not shown).

The above-described devices were listed on the purpose of satisfying all of the several methods described below. It should be noted that in some methods for feeding raw material certain devices could be omitted.

Figure 14:
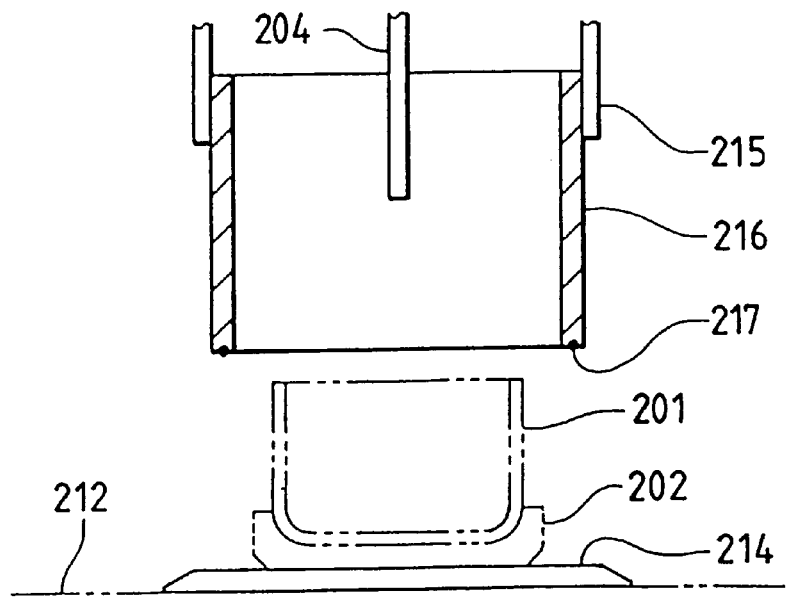
FIG. 14 is a schematic view illustrating part of an apparatus for feeding raw material according to second embodiment of the invention.

FIG. 14 is a schematic view illustrating an apparatus for feeding raw material according to the seventh embodiment of the invention. A bottom plate 214 is disposed on the topmost side of the conveyer 212. A cylinder 216 which can be moved upward and downward by the use of a rod 215 over the bottom plate 214, surrounds the water supply hose 204 which can supply pure water. In addition, the cylinder 216 is much higher than the quartz crucible 201. A ring 217 is installed on the bottom of cylinder 216. If the cylinder 216 is lowered to reach the cylinder 216 then the cylinder 216 functions as a bucket containing the quartz crucible 201 and support table 202 simultaneously. Furthermore, means for raising/lowering a draining hose, the same as that in the sixth embodiment, a container 206 for storing grain-shaped raw material 205, a container 208 for storing piece-shaped ices 207, a container 210 for storing lump raw material 209 and microwave oven 211 are installed on the downstream side of the bottom plate 214. However, it should not be limited that all of above-mentioned devices are necessary in certain methods for feeding raw material.

Figure 16:
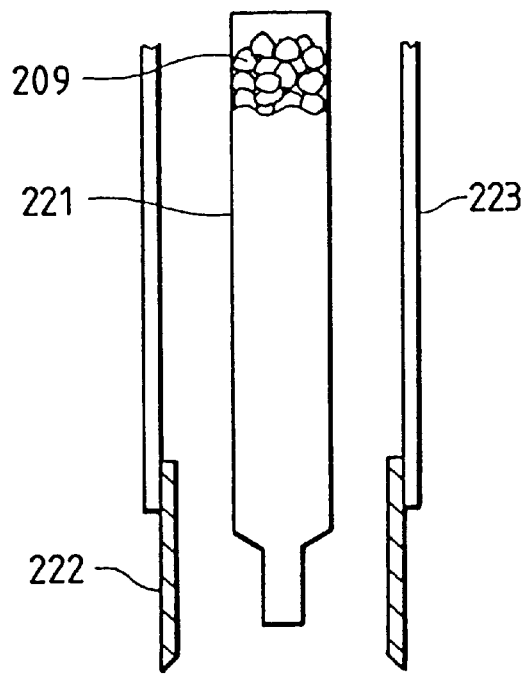
FIG. 16 is a schematic view illustrating an apparatus for feeding raw material according to sixth embodiment of the invention.
Figure 17:
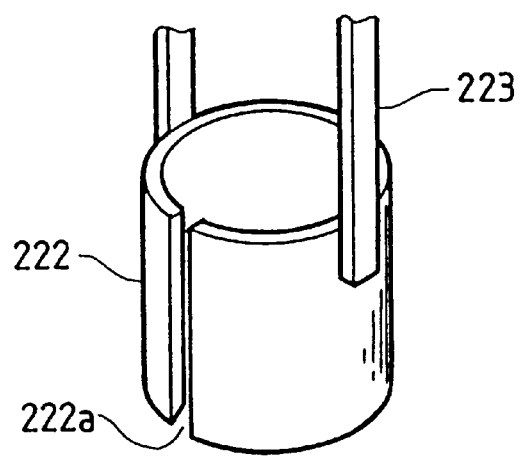
FIG. 17 is a perspective view illustrating a tube.

FIG. 16 is a schematic view illustrating part of an apparatus for feeding raw material according to the eighth embodiment of the invention. This apparatus for feeding raw material comprise a container 221 instead of the container 210 shown in FIG. 13 for storing lump raw material and a tube 222 surrounding the container 221. The container 221 can be raised/lowered, and moved back and fourth in horizontal direction. The tube 222 is a cylinder which covers the inner sidewall of the quartz crucible when lowering the tube 222, is made of material the same as that of bags used to pack the lump raw material 209, and is fixed on a rod 223 which can be freely raised and lowered. Referring to FIG. 17, in order to avoid obstacle caused by the draining hose 203 shown in FIG. 13, there is a slit 222a designed on the side of the tube 222. Furthermore, the tube 222 and turn table 213 (shown in FIG. 13) are capable of being rotated in synchronization. Other devices constructing the apparatus for feeding raw material are the same to those shown in FIG. 13, and their description is thus omitted.

Various methods for feeding raw material into a quartz crucible according to the invention will be described hereinafter in order. The method for feeding raw material according to the sixth embodiment can moderate impacts added to a quartz crucible, resulting from the falling lump raw material, by use of pure water. In FIG. 13, the quartz crucible 201 disposed on the support table 202 can be conveyed on the downside of the water supply hose 204. A draining hose 203 is lowered and disposed inside the quartz crucible 201. One end of the draining hose 203 is lowered to reach the bottom of the quartz crucible 201. After that, the quartz crucible 201 is conveyed just under the water supply hose 204, and pure water is supplied to the quartz crucible 201 from the water supply hose 204. The quartz crucible 201 full of pure water is conveyed onto a turn table 213 installed under a container 210. Then, lump raw material 209 is fed into the quartz crucible 201 from the container 210 which is lowered to a predetermined position. Due to buoyancy of the pure water, the weight of the dropping lump raw material 209 is reduced to about 60% of its original weight. Therefore, impacts applied to the quartz crucible 201 can be obviously moderated, and damages to the quartz can be prevented. In addition, since the quartz crucible 201 is rotated together with the turn table 213, the lump raw material 209 can be equally fed into the quartz crucible 201 with a density the same as that in the man-hand operation.

As a predetermined amount of the lump raw material 209 has been fed, the container 210 is raised to the original position. A draining pump (not shown) connected to the draining hose 203 is driven to drain the pure water out of the quartz crucible 201. Contamination substances created by processes of packing, conveying, opening, etc. for the lump polycrystalline silicon 209 are washed out by use of the pure water, and then discharged out through the draining hose 203. After draining, the draining hose 203 is automatically pulled up and retracted from the quartz crucible 201.

Thereafter, the quartz crucible 201 fed with raw material is conveyed into the microwave oven 211 together with the support tale 202, and then heated at an environment full of dust-removed air or nitrogen. At this time, in order to prevent SiO$_2$ from being created on the lump raw material 209, the heating temperature should be well controlled to avoid overheat. After moisture adhesive on the quartz crucible 201 has been removed, the quartz crucible 201 is moved out of the microwave oven 211, and conveyed to a predetermined position near to an apparatus for manufacturing single-crystal by CZ method.

Figure 15:
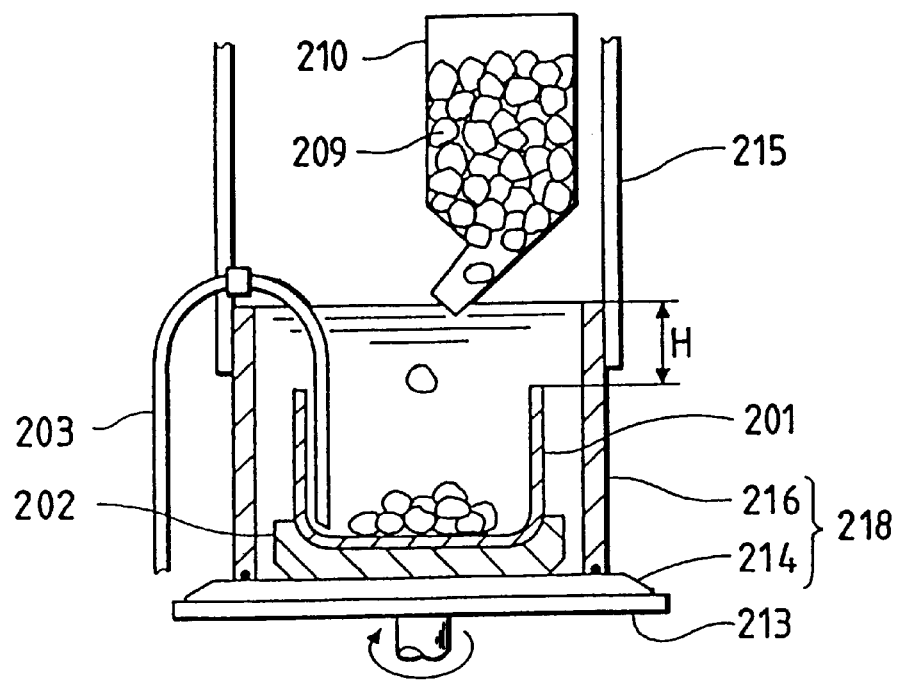
FIG. 15 is a schematic view illustrating an apparatus for feeding raw material according to second embodiment of the invention.

FIG. 14 is a schematic view showing an apparatus for feeding raw material according to the seventh embodiment of the invention. A quartz crucible 201 is conveyed together with a support table 202 onto a bottom plate 214. A cylinder 216 installed on a rode 215 is lowered to press against the bottom plate 214. Therefore, the quartz crucible 201 and support table 202 is contained in a bucket constructed by the cylinder 216 and bottom plate 214. At this point, a draining hose 203 is lowered and disposed in the quartz crucible 201, as shown in FIG. 15. On end of the draining hose 203 is lowered to reach the bottom of the quartz crucible 201; the other end of the draining hose 203 passed over the top of the bucket 218 to connect to a draining pump (not shown). Next, pure water is supplied from the water supply hose 204. The bucket 218 is completed filled with pure water following that the quartz crucible 201 has been full of pure water.

The bucket 218 and quartz crucible 201 full of pure water are conveyed onto the turn table 213 disposed under the container 210 as shown in FIG. 15. The lump raw material 209 is fed into the quartz crucible 201 which is rotated together with the bucket 218, from the container 210. Since buoyancy caused by the pure water is applied on the lump raw material 209, impacts added to the quartz crucible 201 are obviously moderated. Moreover, since a layer of pure water exists between the tops of the quartz crucible 201 and bucket 218, buoyancy is applied to the falling lump raw material 209, and therefore impacts added to the quartz crucible 201, resulting from the falling raw material, can be eliminated.

If a predetermined amount of lump raw material 209 is fed into the quartz crucible 201, the bucket 218 is conveyed on the downstream side of the container 210, and only the cylinder 216 is raised. Therefore, the pure water inside the bucket 218 is discharged through a gap between the cylinder 216 and bottom plate 214. After that, a draining pump (not shown) connected to the draining hose 203 is driven to discharge the pure water out of the quartz crucible 201 with the draining hose 203 therein. Contamination substances created by processes of packing, conveying, opening, etc. for the lump polycrystalline silicon 209 are washed out by use of the pure water, and discharged out through the draining hose 203. After draining, the draining hose 203 is automatically pulled up and retracted from the quartz crucible 201. In addition, the cylinder 216 is raised to the original height. The description for a subsequent drying process which is the same as that stated in the sixth embodiment of the invention is omitted.

Figure 18:
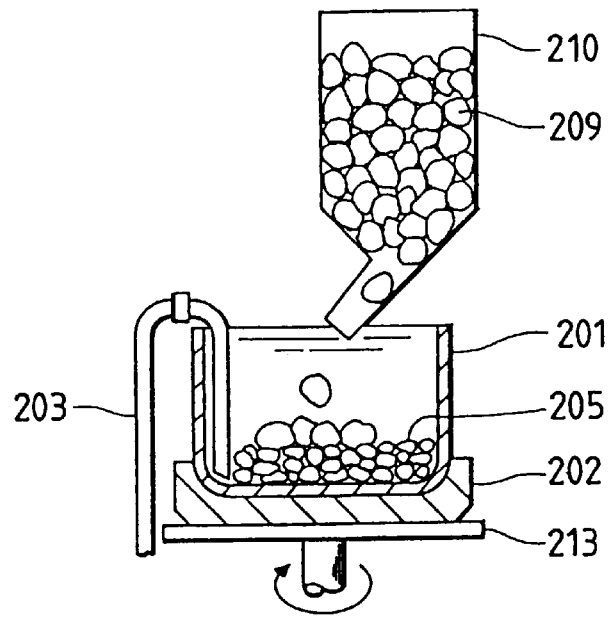
FIG. 18 is a schematic view illustrating an apparatus for feeding raw material according to third embodiment of the invention.

In the eighth embodiment of the invention, pure water and small piece-shaped or grain-shaped raw material are used as buffer materials for the falling raw material which will be fed into a quartz crucible. In the apparatus for feeding raw material as shown in FIG. 13, the drain hose 203 is disposed, and the quartz crucible 201 full of pure water is conveyed onto the turn table installed under the container 206. At this time, The quartz crucible 201 is rotated together with the support table 202, and small piece-shaped or grain-shaped material 205 is fed into the quartz crucible 201 from the container 206. After the bottom of the quartz crucible 201 has been covered with small piece-shaped or grain-shaped material with a thickness of above 3 cm, the quartz crucible 201 is conveyed onto the turn table 213 installed under the container 210 as shown in FIG. 18, and then lump raw material 209 is fed into the quartz crucible 201 from the container 210. If a predetermined amount of raw material is fed into the quartz crucible 201, a draining pump (not shown) connected to a draining hose 203 is driven to discharge the pure water inside the quartz crucible 201, and then the draining hose 203 is retracted from the quartz crucible 201. The description for a subsequent drying process which is the same as that stated in the sixth embodiment of the invention will be omitted here. The above-mentioned method for feeding raw material is also suitable to the seventh embodiment shown in FIG. 14.

Figure 19:
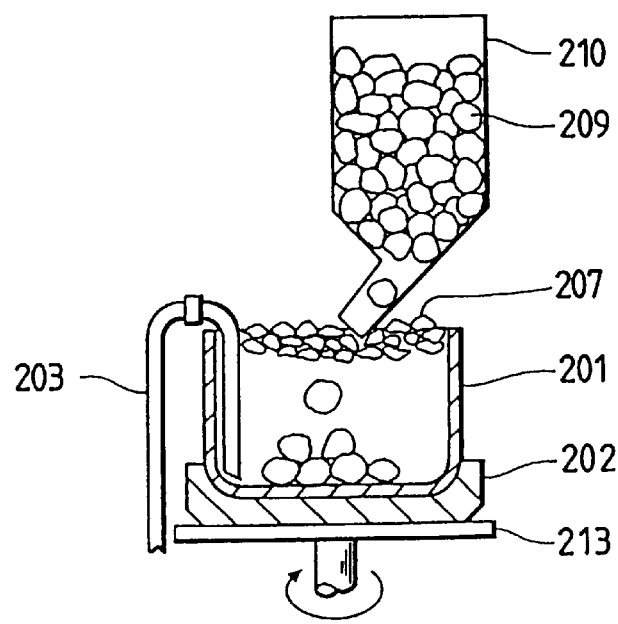
FIG. 19 is a schematic view illustrating an apparatus for feeding raw material according to fourth embodiment of the invention.

In the ninth embodiment of the invention, pure water and piece-shaped ices are used as buffer materials for the falling lump raw material which will be fed into a quartz crucible. In an apparatus for feeding raw material as shown in FIG. 13, a draining hose 203 is installed, and a quartz crucible 201 completely filled with pure water is conveyed onto a turn table disposed under a container 208. At this point, the quartz crucible 201 is rotated together with a support table 202, and piece-shaped ices 207 are fed into the quartz crucible 201 from the container 208. The piece-shaped ices float on the surface of the pure water fully inside the quartz crucible 201 without gaps. If a predetermined amount of piece-shaped ices 207 are fed into the quartz crucible 201, the quartz crucible 201 is conveyed onto a turn table 213 installed under a container 210 as shown in FIG. 19, and then lump material 209 is fed into the quartz crucible 201 from the container 210. The falling speed of the lump raw material 209 is decreased by the floating ices 207. In addition, the lump raw material 209 is applied with buoyancy of the pure water. Since the process after feeding a predetermined amount of raw material into the quartz crucible 201 is the same as that in the eighth embodiment, their description is omitted here. Meanwhile, the method for feeding raw material according to the ninth embodiment is suitable to the seventh embodiment shown in FIG. 14, and the piece-shaped of ices may float inside the bucket.

Figure 20:
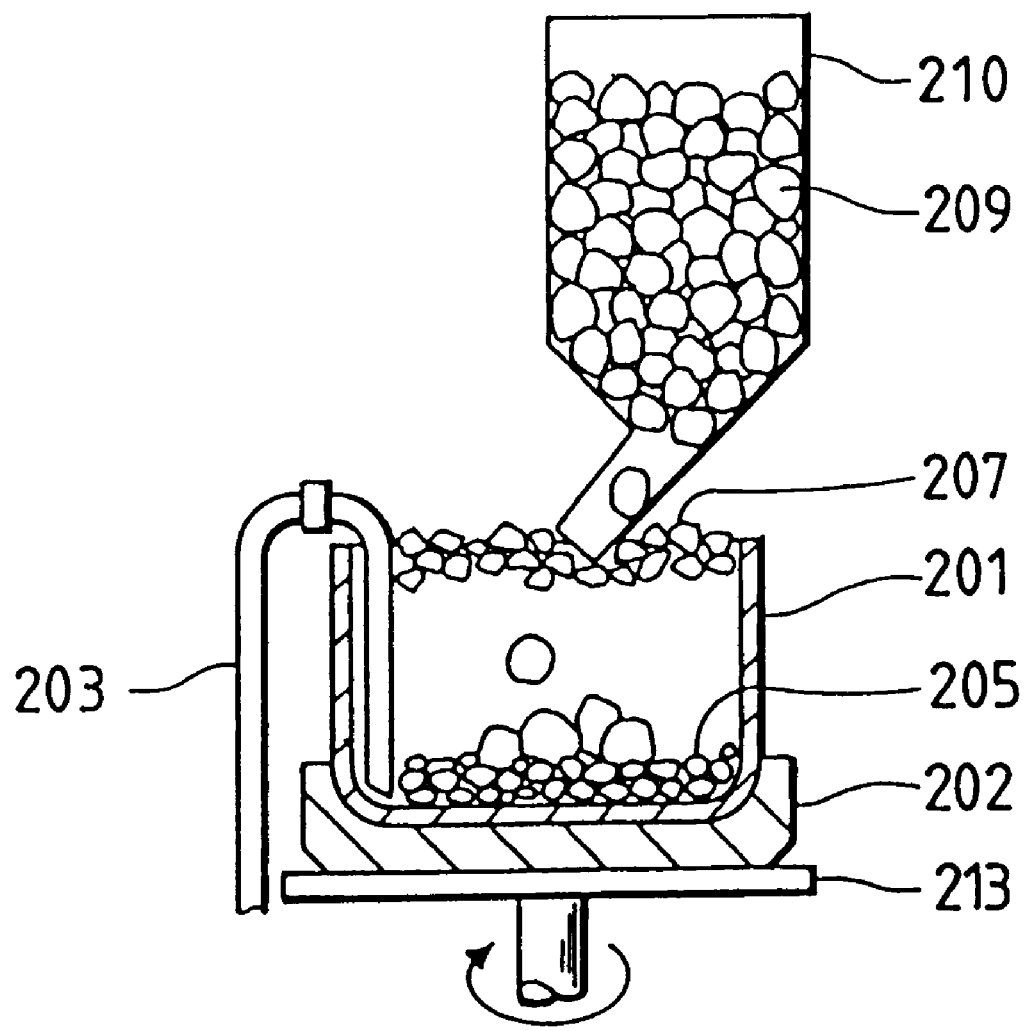
FIG. 20 is a schematic view illustrating an apparatus for feeding raw material according to fifth embodiment of the invention.

A method for feeding raw material according to the tenth embodiment is combination of those of the eighth embodiment and the ninth embodiment. In an apparatus for feeding raw material as shown in FIG. 13, piece-shaped or grain-shaped of raw material is first fed into a quartz crucible 201 full of pure water, from a container 206. Therefore, the bottom of the quartz crucible 201 is covered with the small piece-shaped or grain-shaped of raw material. Next, piece-shaped ices are fed from a container 208, and float on the surface of the pure water fully inside the quartz crucible 201 without any gaps. Thereafter, the quartz crucible 201 is conveyed onto a turn table 213 installed under a container 210 as shown in FIG. 20. Then, lump raw material 209 is fed into the quartz crucible 201 from the container 210. Therefore, the falling speed of the lump raw material 209 is reduced by the piece-shaped ices 207. Moreover, the lump raw material 209 is applied with buoyancy of the pure water, and accumulate on the small piece-shaped or grain-shaped raw material 205. Since the process after feeding a predetermined amount of raw material into the quartz crucible is the same to that in the eighth embodiment, their description is omitted here.

The method for feeding raw material according to the tenth embodiment is suitable to the seventh embodiment shown in FIG. 14.

Figure 21:
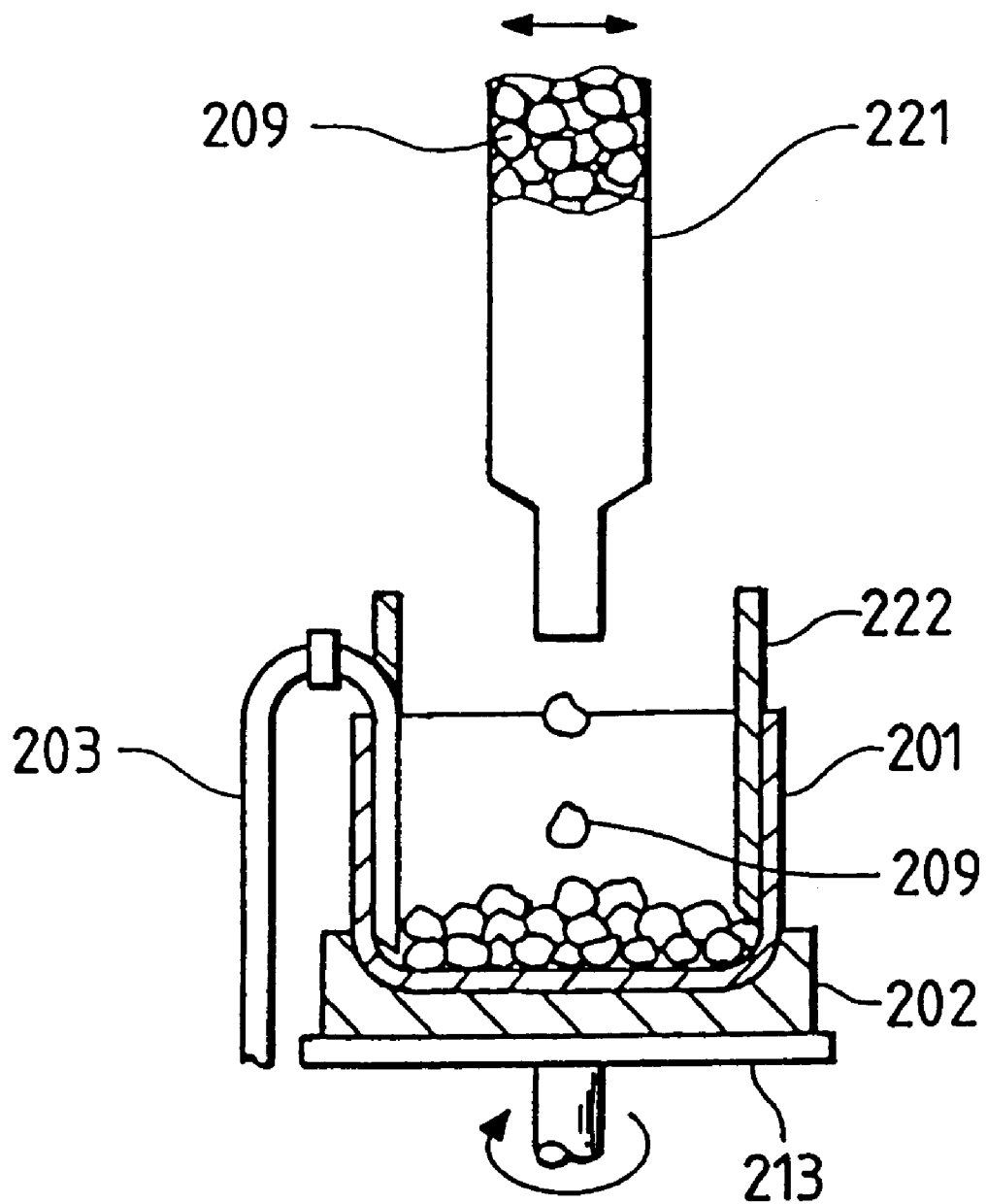
FIG. 21 is a schematic view illustrating an apparatus for feeding raw material according to sixth embodiment of the invention.

In a method for feeding raw material according to the eleventh embodiment, the inner sidewall of a quartz crucible is covered with a tube. A draining hose 203 is disposed in a quartz crucible 201 as shown in FIG. 21. After the quartz crucible 201 is completely filled with pure water which is supplied through a water supply hose, the quartz crucible 201 is conveyed onto a turn table 213 installed under a container 221. At this time, a tube 222 (shown in FIGS. 16 and 17) surrounding the container 221 is lowered to insert into the quartz crucible 201, so that the inner sidewall of the quartz crucible 201 is totally cover by the tube 222. At this moment, since the position of the draining hose 203 disposed into the quartz crucible 201 is consistent with that of a slit 222a on the side of the tube 2122, the draining hose 203 is not able to interfere with inserting the tube 222 into the quartz crucible 201.

After that, the container 221 is lowered to a predetermined feeding position, and then lump raw material 209 is fed from the container 221. At this time, since the quartz crucible 201 is rotated together with a turn table 213, and the container 221 is moved back and forth in horizontal direction with a predetermined stroke, the lump raw material 209 can be evenly fed into the quartz crucible 201. Furthermore, since the tube 222 is rotated in synchronization with the turn table 213, frictions between the lump raw material 209 fed into the quartz crucible 201 and the tube 222 is eliminated. The inner sidewall of the quartz crucible is completely covered by the tube 222, so impacts caused by the falling lump raw material 209 can be prevented, and therefore, there are no damages added to the quartz crucible 201.

The tube 222 is slowly raised in line with the process of feeding the lump raw material 209, and then entirely separated with the quartz crucible 201 after feeding lump raw material 209 is end. In addition, the tube 222 is raised to the original position together with the container 221. Since the process after feeding a predetermined amount of raw material into the quartz crucible 201 is the same as that in the eighth embodiment, their description is omitted. The method for feeding raw material according to the eleventh embodiment is suitable to the seventh embodiment shown in FIG. 14.

In the method for feeding raw material according to the eleventh embodiment, before feeding the lump raw material 209 into the quartz crucible 201, the piece-shaped or grain-shaped raw material 205 may be fed from the container 206 to cover the bottom of the quartz crucible 201, and piece-shaped ices 207 may be fed from the container 208 as shown in FIG. 13. According to this method, the inner sidewall of the quartz crucible 201 can be well protected by the tube 222, and the bottom side of the quartz crucible 201 can be efficiently protected by the small piece-shaped or grain-shaped raw material or the small piece-shaped or grain-shaped raw material and ices. Therefore, impacts caused by the falling lump raw material 209 can be markedly alleviated.

In the all embodiments described above, since the lump raw material and small piece-shaped or grain-shaped raw material are washed out by disposing them into the pure water, most of contamination substances created during processes of packing, conveying, opening, etc. for the lump polycrystalline silicon 209 are removed, and contamination caused by man-hand in the past never occurs. Therefore, the problem of created-suddenly contamination higher than the average contamination standard can be resolved. For example, in the created-suddenly contamination, the level of the most high-frequently created contained carbon is lower than about 0.8, and the level of contained metal is also lower than about 0.8.

According to the invention described above, since feeding raw material into a quartz crucible is performed by using combination of apparatuses with simple structures instead of man-hand operation of the prior art in which longer operation time is needed, labor-saving function and rapid operation can be achieved. Furthermore, since pure water is used as a buffer material during feeding raw material, contamination substances adhesive to the raw material are cleaned out, and therefore, the quality of grown single-crystal silicon is better than that in prior art. Based on those advantages of the invention, maximization in diameter and weight for manufacturing single-crystal silicon by CZ method can be efficiently attained.

What is claimed is:

1. A method of feeding raw material into a crucible before pulling silicon single crystal from the crucible by the CZ method, comprising the steps of:

covering the inner wall surface of the crucible with a buffer of any one or a mixture of those selected from the group of pieces of polycrystalline silicon, grains of polycrystalline silicon, pure-water snow, sherbet-shaped pure-water ice, pure-water ice pieces, or pure-water ice before feeding polycrystalline silicon lumps as raw material into the crucible;

feeding polycrystalline silicon lumps as raw material into the crucible;

pouring pure water into the crucible to melt the buffer left therein so as to expel the water out of the crucible after the step of feeding drying the crucible and the polycrystalline silicon lumps in the crucible.

2. The method of feeding raw material into a crucible as claimed in claim 1, wherein the pouring step comprises a step of pouring a heated water into the crucible.

3. The method of feeding raw material into a crucible as claimed in claim 1, wherein the steps of covering further comprises the steps of covering the covered inner wall surface of the crucible with any one or a mixture of pure-water snow or pure-water ice pieces.

4. The method of feeding raw material into a crucible as claimed in claims 1, wherein the steps of covering comprises a step of fixing a ring shaped pure-water ice to the inner sidewall surface of the crucible.

5. A method of feeding raw material into a crucible as claimed in claims 4, wherein the steps of covering further comprises the steps of covering the covered inner wall surface of the crucible with a second buffer of any one or a mixture of those selected from pieces of polycrystalline silicon, grains of polycrystalline silicon, pure-water snow, or pure-water ice pieces.

6. A method of feeding raw material into a crucible as claimed in claim 1, wherein the steps of covering comprises the steps of:
covering at least the bottom part of the inner surface of the crucible with the buffer; and
covering the inner sidewall of the crucible with a resin tube capable of moving up and down.

7. A method for feeding raw material into a crucible as claimed in claims 6, wherein after feeding polycrystalline silicon lumps, the resin tube is moved up and withdrawn from the crucible.

8. The method of feeding raw material into a crucible as claimed in claims 7, wherein the resin tube is gradually raised in response to the progress of feeding the polycrystalline silicon lumps, and the resin tube is completely withdrawn from the crucible at the end of feeding the polycrystalline silicon lumps.

9. The method of feeding raw material into a crucible before pulling silicon single crystal from the crucible by the CZ method, comprising the steps of:

covering the inner wall surface of the crucible with a buffer of piece-shaped or grain-shaped polycrystalline silicon before feeding polycrystalline silicon lumps as raw material into the crucible;

covering the inner sidewall of the crucible with a resin tube capable of moving up and down; and feeding polycrystalline silicon lumps as raw material into the crucible.

10. The method of feeding raw material into a crucible, before pulling silicon single crystal from the crucible by the CZ method, comprising the steps of:

filling a crucible with pure water; and feeding lump polycrystalline silicon as raw material into said pure water.

11. The method of feeding raw material into a crucible as claimed in claim 10, further comprising:

feeding small piece-shaped or grain-shaped of polycrystalline silicon or their mixture with a predetermined thickness on the bottom of said crucible before feeding said lump polycrystalline silicon.

12. The method of feeding raw material into a crucible as claimed as claim 10, further comprising:

feeding piece-shaped or sherbet-shaped ices or their mixture made of pure water into said crucible before feeding said lump polycrystalline silicon.

13. The method of feeding raw material into a crucible as claimed in claim 10, further comprising:

feeding piece-shaped or grain-shaped polycrystalline silicon or their mixture, and piece-shaped or sherbet-shaped ices or their mixture made of pure water into said crucible before feeding said lump polycrystalline silicon.

14. The method of feeding raw material into a crucible as claimed in claim 10, performed before feeding said lump polycrystalline silicon, further comprising:

covering the inner sidewall of said crucible with a tube which can be freely moved upward and downward; and moving said tube out of said crucible upon the end of feeding said lump polycrystalline silicon, or raising the tube corresponding to the process of feeding said lump polycrystalline silicon and moving said tube out of said crucible completely upon ending the feeding of said lump polycrystalline silicon.

15. The method of feeding raw material into a crucible as claimed in claim 10, further comprising:

drying said polycrystalline silicon and said crucible after feeding lump polycrystalline silicon as raw material.

16. The method of feeding raw material into a crucible before pulling silicon single crystal from the crucible by the CZ method, comprising: comprising the steps of:

disposing a crucible into a bucket deeper than said crucible;

filling said crucible and said bucket with pure water; and feeding lump polycrystalline silicon into said crucible.

* * * * *

UNITED STATES PATENT AND TRADEMARK OFFICE
CERTIFICATE OF CORRECTION

PATENT NO.: 6,007,621
DATED: December 28, 1999
INVENTOR: Yoshifumi YATSURUGI

It is certified that an error appears in the above-identified patent and that said Letters Patent is hereby corrected as shown below:

On front page of patent, under Assignee, delete "Elctronic" and insert --Electronic--.

Signed and Sealed this

Third Day of April, 2001

*Attest:*

NICHOLAS P. GODICI

*Attesting Officer*      *Acting Director of the United States Patent and Trademark Office*